United States Patent
Hamano et al.

(10) Patent No.: US 10,412,295 B2
(45) Date of Patent: Sep. 10, 2019

(54) IMAGE CAPTURING APPARATUS AND CONTROL METHOD THEREOF, AND STORAGE MEDIUM

(71) Applicant: CANON KABUSHIKI KAISHA, Tokyo (JP)

(72) Inventors: Hideyuki Hamano, Kawasaki (JP); Koichi Fukuda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 29 days.

(21) Appl. No.: 15/926,527

(22) Filed: Mar. 20, 2018

(65) Prior Publication Data

US 2018/0278830 A1 Sep. 27, 2018

(30) Foreign Application Priority Data

Mar. 27, 2017 (JP) .................... 2017-061883

(51) Int. Cl.
*H04N 5/232* (2006.01)
*G03B 7/085* (2006.01)
(Continued)

(52) U.S. Cl.
CPC ........... *H04N 5/23212* (2013.01); *G02B 7/09* (2013.01); *G02B 7/346* (2013.01); *G03B 7/085* (2013.01); *G03B 13/32* (2013.01); *G03B 13/36* (2013.01); *H01L 27/146* (2013.01); *H04N 5/232* (2013.01); *H04N 5/23296* (2013.01);
(Continued)

(58) Field of Classification Search
CPC .......... G02B 7/09; G02B 7/346; G03B 13/32; G03B 13/36; G03B 7/085; H01L 27/146; H01L 27/14641; H04N 5/232; H04N 5/23212; H04N 5/232122; H04N 5/23296; H04N 5/3572; H04N 5/37457; H04N 9/045

See application file for complete search history.

(56) References Cited

U.S. PATENT DOCUMENTS 9,826,139 B2 * 11/2017 Fukuda ............... H04N 5/23212
2012/0327267 A1 * 12/2012 Takahara ................. G02B 7/34
348/231.99

(Continued)

FOREIGN PATENT DOCUMENTS

JP 5879762 B2 3/2016

*Primary Examiner* — Chia Wei A Chen
(74) *Attorney, Agent, or Firm* — Carter, DeLuca & Farrell LLP

(57) ABSTRACT

An image capturing apparatus includes: a focus detection unit configured to detect a focus state of an imaging optical system; a reliability determination unit configured to determine reliability of the focus detection; and a control unit configured to control an opening of an aperture of the imaging optical system, wherein the control unit, if the reliability determination unit determines that reliability of the focus detection performed in a state in which the opening of the aperture is controlled to a first aperture opening state is less than a threshold value, changes the aperture to a second aperture opening state in which the opening of the aperture is reduced relative to the first aperture opening state, and wherein the control unit does not change the aperture to the second aperture opening state if a predetermined condition is satisfied.

19 Claims, 12 Drawing Sheets

(51) Int. Cl.
  *G03B 13/32* (2006.01)
  *G02B 7/09* (2006.01)
  *G02B 7/34* (2006.01)
  *G03B 13/36* (2006.01)
  *H01L 27/146* (2006.01)
  *H04N 5/357* (2011.01)
  *H04N 9/04* (2006.01)
  *H04N 5/3745* (2011.01)

(52) U.S. Cl.
  CPC ..... *H04N 5/232122* (2018.08); *H04N 5/3572* (2013.01); *H04N 5/37457* (2013.01); *H04N 9/045* (2013.01); *H01L 27/14641* (2013.01)

(56) References Cited

U.S. PATENT DOCUMENTS

| | | | | |
|---|---|---|---|---|
| 2014/0300792 | A1* | 10/2014 | Nakamura | H04N 5/23212 348/333.08 |
| 2015/0163395 | A1* | 6/2015 | Konishi | H04N 5/2353 348/230.1 |
| 2017/0034426 | A1 | 2/2017 | Fukuda | |
| 2018/0205875 | A1* | 7/2018 | Nakamaru | G02B 7/28 |
| 2019/0041604 | A1* | 2/2019 | Tanaka | G02B 7/09 |

* cited by examiner

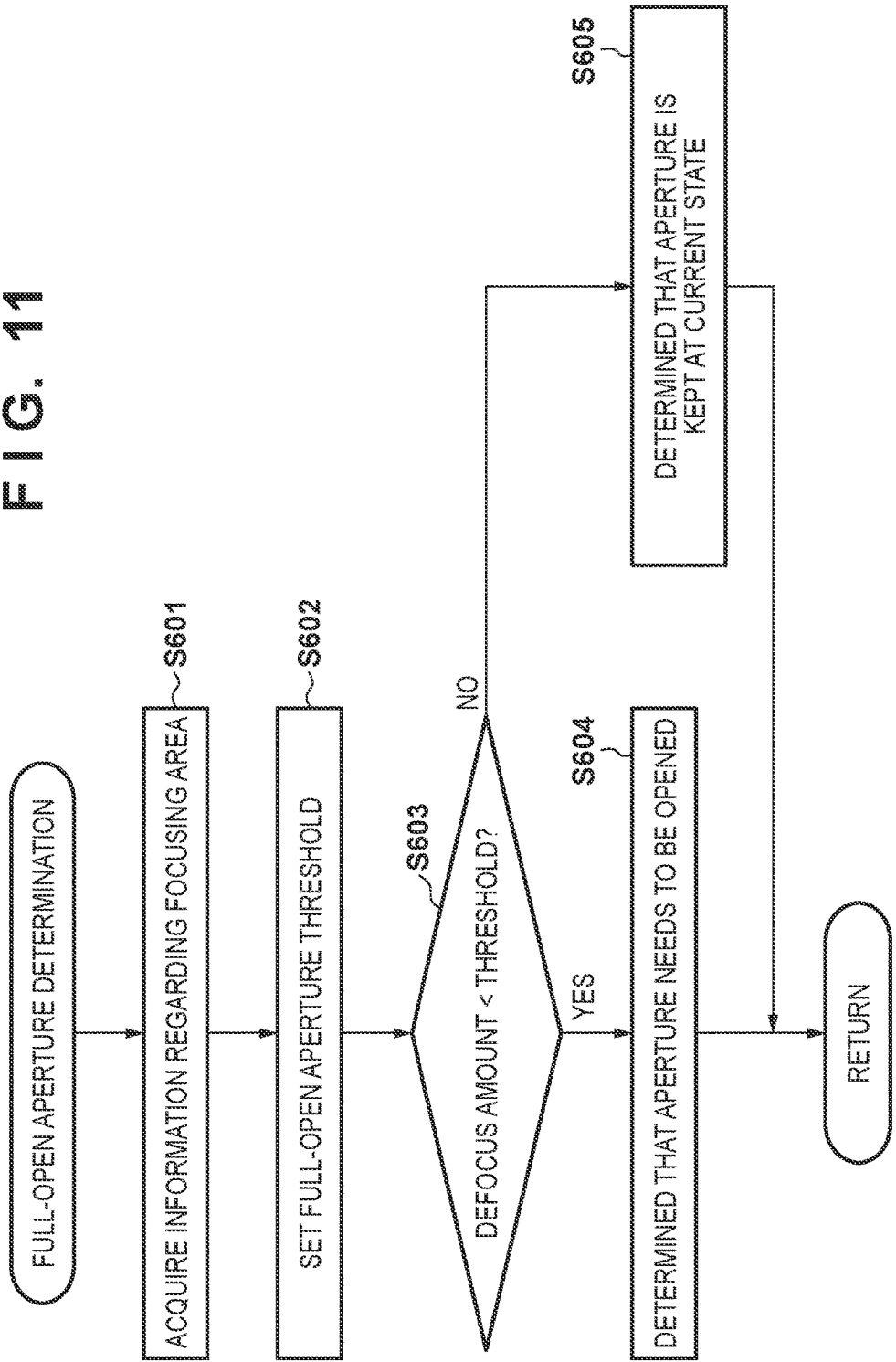

IMAGE CAPTURING APPARATUS AND CONTROL METHOD THEREOF, AND STORAGE MEDIUM

BACKGROUND OF THE INVENTION

Field of the Invention

The present invention relates to an image capturing apparatus provided with an image sensor including a focus detection pixel.

Description of the Related Art

Heretofore, an image capturing apparatus is known that performs autofocusing using a phase difference detection method by using an image sensor including a focus detection pixel.

For example, an apparatus that performs pupil-division type focus detection using a two-dimensional image sensor in which a micro lens is formed in each pixel is disclosed in Japanese Patent No. 5879762. In the case of receiving light beams that have passed through pupil areas that are different from each other in the imaging optical system via the micro lens, the accuracy of the focus detection is likely to be affected by the focus condition of the imaging optical system. In the case of a focus condition in which the amount of blur is large, that is, in the case where a defocus amount is large, the shape of a signal that is used for focus detection is deformed, and an error included in a detected defocus amount increases. Also, the influence of blur increases as the defocus amount increases, and the reliability of a focus detection result decreases. Therefore, there are cases where a reliable focus detection result is not obtained.

It is known that, when a reliable focus detection result cannot be obtained, so-called search driving is performed in which whether or not a reliable focus detection result can be obtained is searched for by driving a focus lens. With the search driving, an object with respect to which focus detection can be performed can be searched for, and the frequency of the focus adjustment being successful increases, but there is a problem in that the focus adjustment time increases.

In the apparatus disclosed in Japanese Patent No. 5879762, the influence of blur described above is reduced by performing driving such that, when focus detection is not possible, the aperture is temporarily reduced, focus detection is performed in this state, and thereafter the aperture is opened. The depth of focus increases when the aperture is decreased, and therefore the frequency of successful detection of defocus information including a defocus direction increases. Accordingly, the frequency of search driving can be reduced, and an increase in the focus adjustment time can be suppressed.

However, in the focus detection method disclosed in Japanese Patent No. 5879762, the aperture is decreased whenever the reliability of a focus detection result obtained in a state in which the aperture is more open is low, and there is a problem such as the following. That is, there is no assurance that focus detection will be possible when the aperture is decreased, and there are cases where the focus detection is not possible even in a state in which the aperture is decreased. There is a problem in that, in such a case, the focus adjustment time increases relative to a case where the search driving is started without decreasing the aperture.

Also, in the method disclosed in Japanese Patent No. 5879762, control is performed such that, when the reliability of a focus detection result obtained in a state in which the aperture is decreased is high, the aperture is immediately returned to the aperture when shooting was performed. A problem, in this case, in that the focus detection again becomes impossible, and the focus adjustment time increases as a result of returning the aperture to a more open state, is not discussed.

SUMMARY OF THE INVENTION

The present invention has been made in view of the above-mentioned problems, and provide an image capturing apparatus in which high speed focus adjustment is possible even in a state in which a defocus amount is large.

According to a first aspect of the present invention, there is provided an image capturing apparatus comprising: a focus detection unit configured to detect a focus state of an imaging optical system; a reliability determination unit configured to determine reliability of the focus detection; and a control unit configured to control an opening of an aperture of the imaging optical system, wherein the control unit, if the reliability determination unit determines that reliability of the focus detection performed in a state in which the opening of the aperture is controlled to a first aperture opening state is less than a threshold value, changes the aperture to a second aperture opening state in which the opening of the aperture is reduced relative to the first aperture opening state, and wherein the control unit does not change the aperture to the second aperture opening state if a predetermined condition is satisfied.

According to a second aspect of the present invention, there is provided a method of controlling an image capturing apparatus, comprising: detecting a focus state of an imaging optical system; determining reliability of the focus detection; and controlling an opening of an aperture of the imaging optical system, wherein in the controlling, if reliability of the focus detection performed in a state in which the opening of the aperture is controlled to a first aperture opening state is less than a threshold value, in the determining reliability, the aperture is changed to a second aperture opening state in which the opening of the aperture is reduced relative to the first aperture opening state, and wherein, in the controlling, the aperture is not changed to the second aperture opening state if a predetermined condition is satisfied.

Further features of the present invention will become apparent from the following description of exemplary embodiments (with reference to the attached drawings).

BRIEF DESCRIPTION OF THE DRAWINGS

FIG. 11 is a flowchart illustrating a subroutine of determining whether or not the aperture is to be fully opened.

DESCRIPTION OF THE EMBODIMENTS

Hereinafter, one embodiment of the present invention will be described in detail with reference to the attached drawings.

Figure 1:
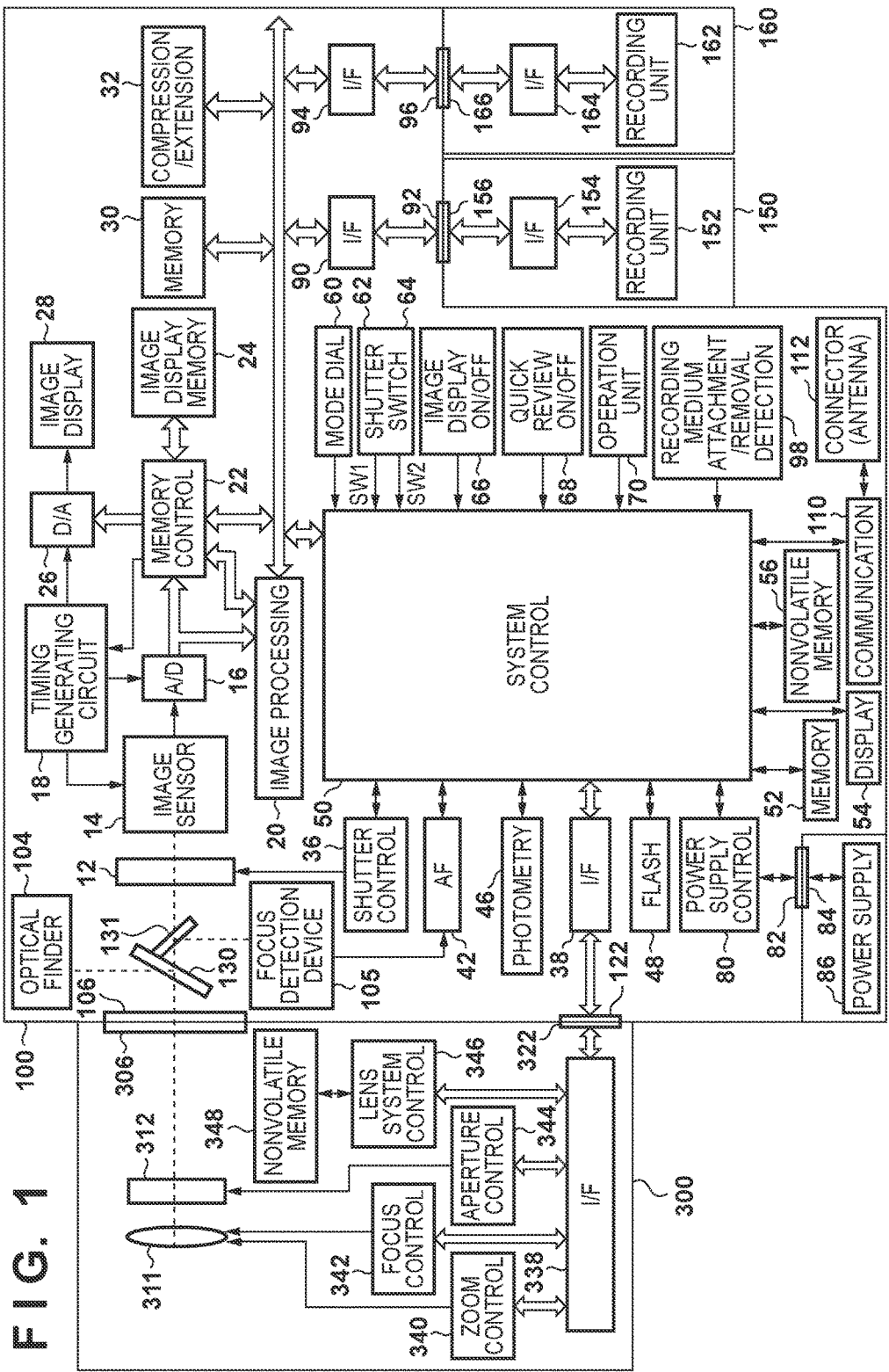
FIG. 1 is a block diagram illustrating a configuration of an image capturing apparatus according to one embodiment of the present invention.

FIG. 1 is a diagram illustrating a configuration of an image capturing apparatus, which is a camera system constituted by a camera in which a plurality of imaging lenses are exchangeable, and a imaging lens, and includes a focus adjustment device. In FIG. 1, a camera system including the focus adjustment device of the present embodiment includes a camera 100 and a imaging lens 300 that is exchangeably attached to the camera 100. First, the configuration of the camera 100 will be described.

The camera 100 is compatible with a camera system including a plurality of types of imaging lenses 300, and a lens of the same type having a different production number can also be attached to the camera 100. Furthermore, the camera 100 is configured such that a imaging lens 300 having a different focal length and a full-open F-number, an imaging lens 300 having a zoom function, and the like can be attached, that is, imaging lenses are exchangeable regardless of whether the type is the same or different.

In this camera 100, a light beam that has passed through the imaging lens 300 passes through a camera mount 106, and is reflected upward by a main mirror 130 so as to be incident on an optical finder 104. While observing an object using the optical finder 104, a photographer can shoot an object as an optical image. Some functions of a display unit 54, such as for example, focus display, camera shake warning display, F-number display, and exposure compensation display, and the like are installed in the optical finder 104.

The main mirror 130 is a semi-transmissive half mirror, and a part of the light beam that is incident on the main mirror 130 passes through this half mirror part and is reflected downward by a sub mirror 131 so as to be incident on a focus-detection device 105. The focus detection device 105 adopts a phase difference detection method AF mechanism constituted by a secondary imaging optical system, converts an obtained optical image to an electric signal, and transmits the electric signal to an AF unit (autofocus unit) 42. The AF unit 42 performs phase difference detection computation using this electric signal. A system control circuit 50 performs control such as focus adjustment processing on a focus control unit 342 (described later) of the imaging lens 300 based on the computation result. In the present embodiment, correction of the focus detection result is performed in the AF unit 42. The AF unit 42 functions as focus detection means.

On the other hand, when performing still image shooting, electronic viewfinder display, or moving image shooting, after the focus adjustment processing of the imaging lens 300 has ended, the main mirror 130 and the sub mirror 131 are moved away from the shooting light beam by a quick return mechanism (not shown). Accordingly, the light beam that has passed through the imaging lens 300 is incident on an image sensor 14 that converts the optical image to an electric signal via a shutter 12 that controls an exposure amount. After the shooting operation of the image sensor 14 has ended, the main mirror 130 and the sub mirror 131 return to the positions as illustrated.

An electric signal generated due to photoelectric conversion by the image sensor 14 is transmitted to an A/D converter 16, and an analog signal output is converted to a digital signal (image data). A timing generation circuit 18 supplies a clock signal and a control signal to the image sensor 14, the A/D converter 16, and a D/A converter 26. The timing generation circuit 18 is controlled by a memory control circuit 22 and a system control circuit 50. An image processing circuit 20 performs predetermined pixel interpolation processing and color conversion processing on image data from the A/D converter 16 or image data from the memory control circuit 22. The image processing circuit 20 performs predetermined computational processing using the image data.

The image sensor 14 includes a portion of the focus detection device, and can carry out a phase difference detection method AF even in a state in which the main mirror 130 and the sub mirror 131 are moved away from the shooting light beam by the quick return mechanism. Image data, of the obtained image data, related to focus detection is converted to focus detection image data by the image processing circuit 20. Thereafter, the focus detection image data is transmitted to the AF unit 42 via the system control circuit 50, and focusing of the imaging lens 300 is performed by the focus adjustment device. Note that so-called contrast type AF is also possible in which the system control circuit 50 controls a focus control unit 342 of the imaging lens 300 to perform focusing based on a computation result obtained by the image processing circuit 20 computing image data of the image sensor 14. Accordingly, although the main mirror 130 and the sub mirror 131 are moved away from the shooting light beam during observing through the electronic viewfinder or while moving image shooting is performed, both the phase difference detection method AF and the contrast type AF can be performed by the image sensor 14. Specifically, since the phase difference detection method AF is possible, high speed focusing is enabled.

In this way, the camera 100 of the present embodiment uses the phase difference detection method AF performed by the focus detection device 105 in normal still image shooting in which the main mirror 130 and the sub mirror 131 are in a shooting optical path. Also, during observing through the electronic viewfinder or while moving image shooting is performed, during which the main mirror 130 and the sub mirror 131 are moved away from the shooting light beam, the phase difference detection method AF and the contrast type AF using the image sensor 14 are used. Therefore, focus can be adjusted in any of the operations of still image shooting, electronic viewfinder observation, and moving image shooting.

The memory control unit 22 controls the A/D converter 16, the timing generating circuit 18, the image processing unit 20, an image display memory 24, the D/A converter 26, a memory 30, and a compression/extension circuit 32. Data of the A/D converter 16 is written into the image display memory 24 or the memory 30 via the image processing unit 20 and the memory control circuit 22, or via only the memory control circuit 22. The image display unit 28 is constituted by a liquid crystal monitor or the like, and display image data written into the image display memory 24 is displayed by the image display unit 28 via the D/A converter 26. As a result of successively displaying captured image data using the image display unit 28, the electronic viewfinder function can be realized. The display in the image display unit 28 can be turned on/off in accordance with an instruction from the system control circuit 50, and when the display is turned off, the power consumption of the camera 100 can be substantially reduced.

Also, the memory 30 is used for storing a shot still image or moving image, and has a memory capacity sufficient for storing a predetermined number of still images and a predetermined duration of moving images. Accordingly, it is possible to perform high-speed writing of a large amount of images into the memory 30 in the case of successive shooting or panoramic shooting as well. Also, the memory 30 can be used as a work area of the system control circuit 50. The compression/extension circuit 32 has the functions of compressing and extending image data using adaptive discrete cosine transformation (ADCT) or the like, and is configured to read an image stored in the memory 30, to perform compression processing or extension processing on the read image, and to write the processed image data to the memory 30.

Based on photometric information from a photometry unit 46, a shutter control unit 36 controls the shutter 12 in cooperation with an aperture control unit 344 for controlling an aperture 312 on the imaging lens 300 side. An interface unit 38 and a connector 122 electrically connect the camera 100 and the imaging lens 300 to each other. These constituent components have a function of transmitting a control signal, a status signal, a data signal, and the like between the camera 100 and the imaging lens 300 and supplying currents at various voltages. Furthermore, the constituent components may be configured to transmit, in addition to electrical communication, optical communication, voice communication, and the like. The photometry unit 46 performs AE processing. As a result of the light beam having passed through the imaging lens 300 being incident on the photometry unit 46 via the camera mount 106, the main mirror 130, and a photometric lens (not shown), it is possible to measure the exposure condition of an image. The photometry unit 46 also has a function of performing light modulation processing in cooperation with a flash 48. Note that, it is also possible for the system control circuit 50 to perform AE control on the shutter control unit 36 and the aperture control unit 344 of the imaging lens 300, based on a computation result obtained by the image processing unit 20 performing computation on image data of the image sensor 14. The flash 48 also has a function of projecting AF auxiliary light and a function of modulating flash light.

The system control circuit 50 controls overall operations of the camera 100, and a memory 52 stores constants, variables, and programs for operations of the system control circuit 50. The display unit 54 is a liquid crystal display device that displays an operation state, a message, and the like using characters, images, sounds, and the like, in accordance with the program being executed by the system control circuit 50. One or a plurality of the display units 54 are installed at one or more positions in the vicinity of the operation unit of the camera 100 at which the units can be easily viewed, and each display unit is constituted by a combination of, for example, a LCD, LEDs, and the like.

Among display contents of the display unit 54, content that is displayed on the LCD or the like includes information on the number of shots, such as the number of recorded images or the number of possible shots, and information on the shooting conditions, such as shutter speed, F-number, exposure compensation, or flash conditions. Moreover, remaining battery level, date/time, and the like are also displayed. As described above, some functions of the display unit 54 are realized in the optical finder 104.

A nonvolatile memory 56 is an electrically erasable/recordable memory, and may use, for example, an EEPROM or the like. The reference numerals 60, 62, 64, 66, 68, and 70 denote operation units for inputting various types of operational instructions to the system control circuit 50, and each unit is configured by one of or a combination of a switch, a dial, a touch panel, a device in which pointing through sight line detection is performed, a voice recognition device, and the like.

A mode dial switch 60 can switch and set function modes such as power off, an automatic shooting mode, a manual shooting mode, a playback mode, or a PC connection mode. The shutter switch SW1 (62) is turned on when an unshown shutter button is pressed half way, and makes an instruction to start operations of AF processing, AE processing, AWB processing, EF processing, or the like. The shutter switch SW2 (64) is turned on when the shutter button is fully pressed, and makes an instruction to start operations of a series of processing regarding shooting. The series of processing regarding shooting includes exposure processing, development processing, recording processing, and the like. In the exposure processing, a signal read from the image sensor 14 is written as image data into the memory 30 via the A/D converter 16 and the memory control circuit 22. In the development processing, results of computation performed in the image processing unit 20 and the memory control circuit 22 are used to perform development. In the recording processing, image data is read from the memory 30, is subjected to compression in the compression/extension circuit 32, and is written as image data into a recording medium 150 or 160.

The image display ON/OFF switch 66 can set the image display unit 28 on/off. With this function, current supply to the image display unit 28, which is constituted by a liquid crystal monitor or the like, is cut off when shooting is performed using the optical finder 104, making power saving possible. The quick review ON/OFF switch 68 sets a quick review function of automatically performing playback of shot image data immediately after shooting an image. The operation unit 70 is constituted by various types of buttons, a touch panel, and the like. The various types of buttons include a menu button, a flash setting button, a switch button for switching between single shooting/successive shooting/self-timer shooting, an exposure compensation button, and the like.

A power supply control unit 80 is constituted by a battery detection circuit, a DC/DC converter, a switching circuit for switching a block to which power is supplied, and the like. Detection is performed as to whether a battery is attached, the type of the battery, and the remaining battery level, the DC/DC converter is controlled based on the detection result and an instruction from the system control circuit 50, and a required voltage is supplied for the required time period to the units including the recording medium. Connectors 82 and 84 connect a power supply unit 86 constituted by a primary battery such as an alkaline battery or a lithium battery, a secondary battery such as a NiCd battery, a NiMH battery, or a lithium ion battery, an AC adapter, or the like, to the camera 100.

Interfaces 90 and 94 have a function of enabling connection to a recording medium such as a memory card or a hard disk, and connectors 92 and 96 are for physically connecting a recording medium such as a memory card or a hard disk. A recording medium attachment/removal detection unit 98 detects whether or not a recording medium is attached to the connector 92 or 96. Note that, in the present embodiment, description is given assuming that two interface systems and two connector systems to each of which a recording medium is attached are provided, but a configuration is also possible in which a single interface system and a single connector system are provided, or multiple interface systems and multiple connector systems are provided. Furthermore, a configuration is also possible in which interfaces and connectors of different standards are provided in a combined manner. Furthermore, by connecting any type of communication card, such as a LAN card, to the interfaces and the connectors, it is possible to transfer image data and administrative information associated with the image data to and from another peripheral device such as a computer or a printer.

A communication unit 110 has a function of performing various types of communication, such as wired communication or wireless communication. A connector 112 connects the camera 100 to another device using the communication unit 110, and the connector 112 is an antenna in the case of wireless communication. Recording media 150 and 160 are memory cards, hard disks, or the like. The recording media 150 and 160 respectively include recording units 152 and 162 constituted by a semiconductor memory, a magnetic disk, or the like, interfaces 154 and 164 for connection to the camera 100, and connectors 156 and 166 for connecting to the camera 100.

Next, the imaging lens 300 will be described. The imaging lens 300 is configured to be able to be attached to and removed from the camera 100. A lens mount 306 mechanically couples the imaging lens 300 to the camera 100, and is exchangeably attached to the camera 100 via the camera mount 106. The camera mount 106 and the lens mount 306 respectively include functions of a connector 122 and a connector 322 for electrically connecting the imaging lens 300 to the camera 100. A lens 311 includes a focus lens for focusing on an object, and an aperture 312 controls the light amount of the shooting light beam.

The connector 322 and an interface 338 electrically connect the imaging lens 300 to the connector 122 of the camera 100. The connector 322 has a function of transmitting a control signal, a status signal, a data signal, and the like between the camera 100 and the imaging lens 300, and is supplied with currents at various voltages. The connector 322 may be configured to transmit, in addition to electrical communication, optical communication, voice communication, and the like. A zoom control unit 340 controls zooming of the lens 311, and the focus control unit 342 controls the operations of the focus lens of the lens 311. The focus control unit 342 and the lens 311 constitute focus adjustment means. When the imaging lens 300 is of a single focus lens type, the zoom control unit 340 may not be provided. Based on the photometric information from the photometry unit 46, the aperture control unit 344 controls the aperture 312 in cooperation with the shutter control unit 36 for controlling the shutter 12. The aperture control unit 344 and the aperture 312 constitute aperture opening adjustment means.

The lens system control circuit 346 controls the entirety of the imaging lens 300. Also, the lens system control circuit 346 includes a memory function for storing constants, variables, and programs for operating the imaging lens. A nonvolatile memory 348 stores identification information such as a number specific to the imaging lens, administrative information, functional information such as a full-open aperture value and a minimum aperture value, focal length, current and previous setting values, and the like. In the present embodiment, information on the lens frame according to the state of the imaging lens 300 is also stored. This lens frame information is information on the distance between the image sensor 14 and a frame opening and the radius of the frame opening that determines the size of the light beam passing through the imaging lens 300. The aperture 312 is included in a frame that determines the size of the light beam passing through the imaging lens, and the opening of a lens frame member for holding the lens, and the like also constitute the frame. Also, because the frame that determines the size of the light beam passing through the imaging lens is different depending on the focus position or zooming position of the lens 311, a plurality of types of lens frame information according to the focus positions and zooming positions of the lens 311 are provided. When the camera 100 performs focus detection using the focus-detection means, appropriate lens frame information that corresponds to the focus position and zooming position of the lens 311 is selected and transmitted to the camera 100 via the connector 322.

The configuration of the camera system constituted by the camera 100 and the imaging lens 300 has been described. Next, a focus detection device constituted by the image sensor 14 will be described in detail. The focus detection device adopts a phase difference detection method AF, similarly to the focus detection device 105. A configuration thereof will be described.

Figure 2A:
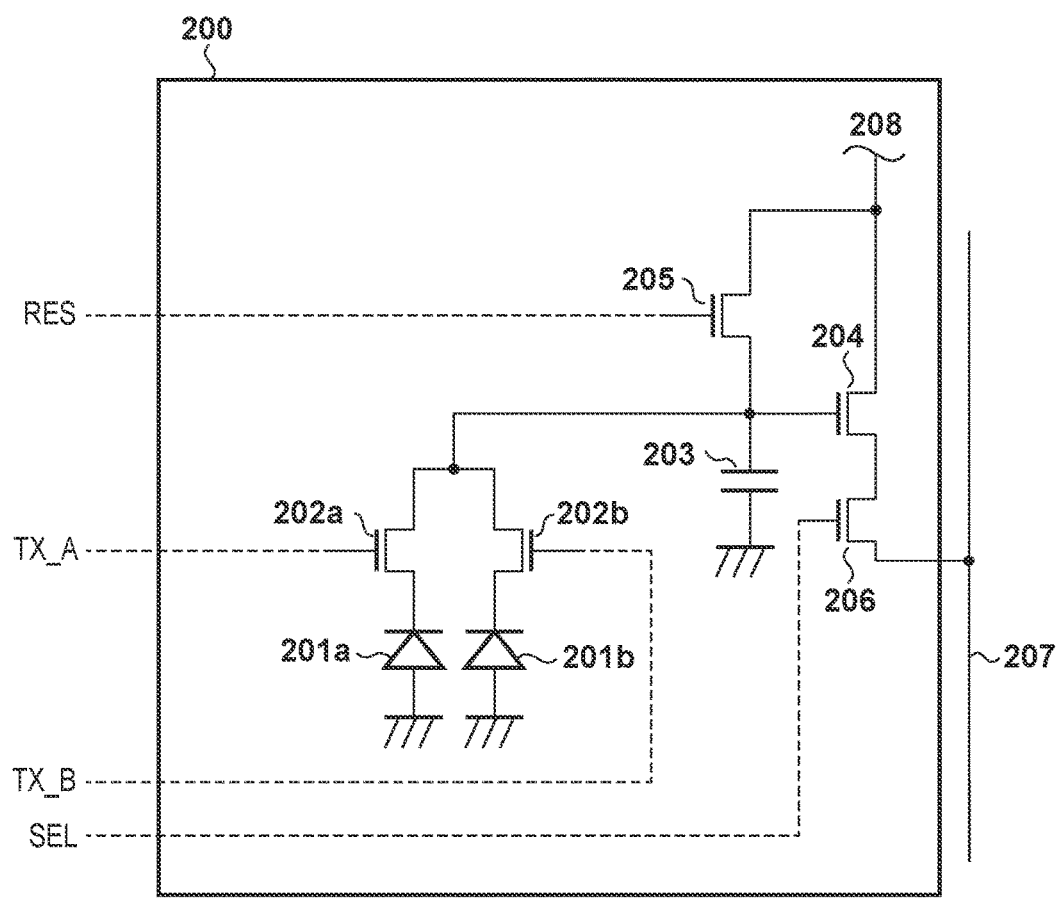
FIG. 2A is a circuit diagram of a pixel of an image sensor.

The configuration of the image sensor 14 shown in FIG. 1 will be described in more detail using FIGS. 2A to 2C. FIG. 2A is a circuit diagram illustrating a configuration of a pixel 200 in the image sensor 14. One pixel 200 includes two photodiodes (PDs) 201a and 201b, two transfer switches 202a and 202b, a floating diffusion region 203, an amplification portion 204, a reset switch 205, and a selection switch 206. Note that the switches may each be constituted by a MOS transistor or the like. In the following description, each switch is assumed to be an N-type MOS transistor, as an example, but the switch may be a P-type MOS transistor, or another switching element.

In this way, the image sensor 14 in the present embodiment includes two photodiodes in one pixel 200. Note that the number of photodiodes provided in each pixel 200 is not limited to two, as shown in FIG. 2A, and may be three or more (four, for example). In the present embodiment, the photodiodes 201a and 201b function as a focus detection pixel and as an image-capturing pixel as well, as will be described later.

Figure 2B:
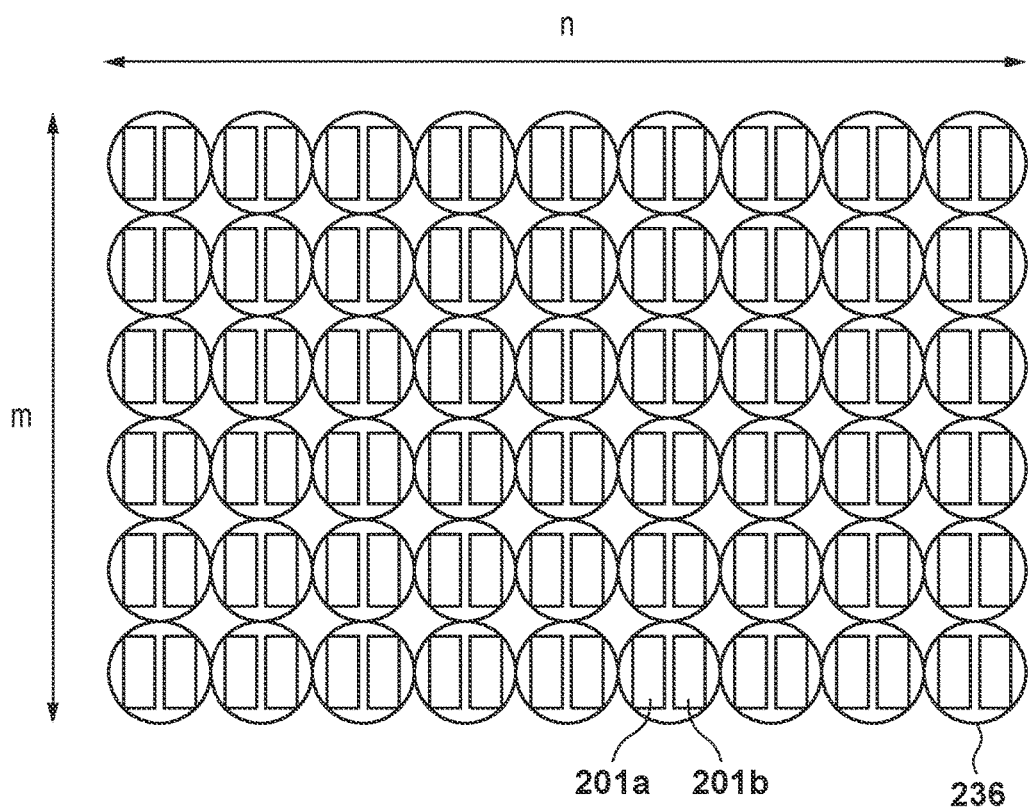
FIG. 2B is a diagram illustrating a pixel arrangement in the image sensor.

The photodiodes 201a and 201b each function as a photoelectric conversion portion that receives light that has passed through the same micro lens 236 shown in FIG. 2B, and generates signal charges according to the amount of received light, by performing photoelectric conversion. A signal obtained by the photodiode 201a is referred to as a signal A, and a signal obtained by the photodiode 201b is referred to as a signal B.

The transfer switch 202a is connected between the photodiode 201a and the floating diffusion region 203, and the transfer switch 202b is connected between the photodiode 201*b* and the floating diffusion region 203. The transfer switches 202*a* and 202*b* are elements that respectively transfer charges generated in the photodiodes 201*a* and 201*b* to the common floating diffusion region 203. The transfer switches 202*a* and 202*b* are respectively controlled by control signals TX_A and TX_B.

The floating diffusion region 203 temporarily holds charges that have been transferred from the photodiodes 201*a* and 201*b*, and functions as a charge-voltage conversion portion that converts the held charges to a voltage signal.

The amplification portion 204 is a source follower MOS transistor. A gate of the amplification portion 204 is connected to the floating diffusion region 203, and a drain of the amplification portion 204 is connected to a common power supply 208 that supplies a power supply potential VDD. The amplification portion 204 amplifies the voltage signal based on the charges held in the floating diffusion region 203, and outputs the amplified signal as an image signal.

The reset switch 205 is connected between the floating diffusion region 203 and the common power supply 208. The reset switch 205 is controlled by a control signal RES, and has a function of resetting the potential of the floating diffusion region 203 to the power supply potential VDD.

The selection switch 206 is connected between a source of the amplification portion 204 and a vertical output line 207. The selection switch 206 is controlled by a control signal SEL, and outputs the image signal subjected to amplification in the amplification portion 204 to the vertical output line 207.

Figure 2C:
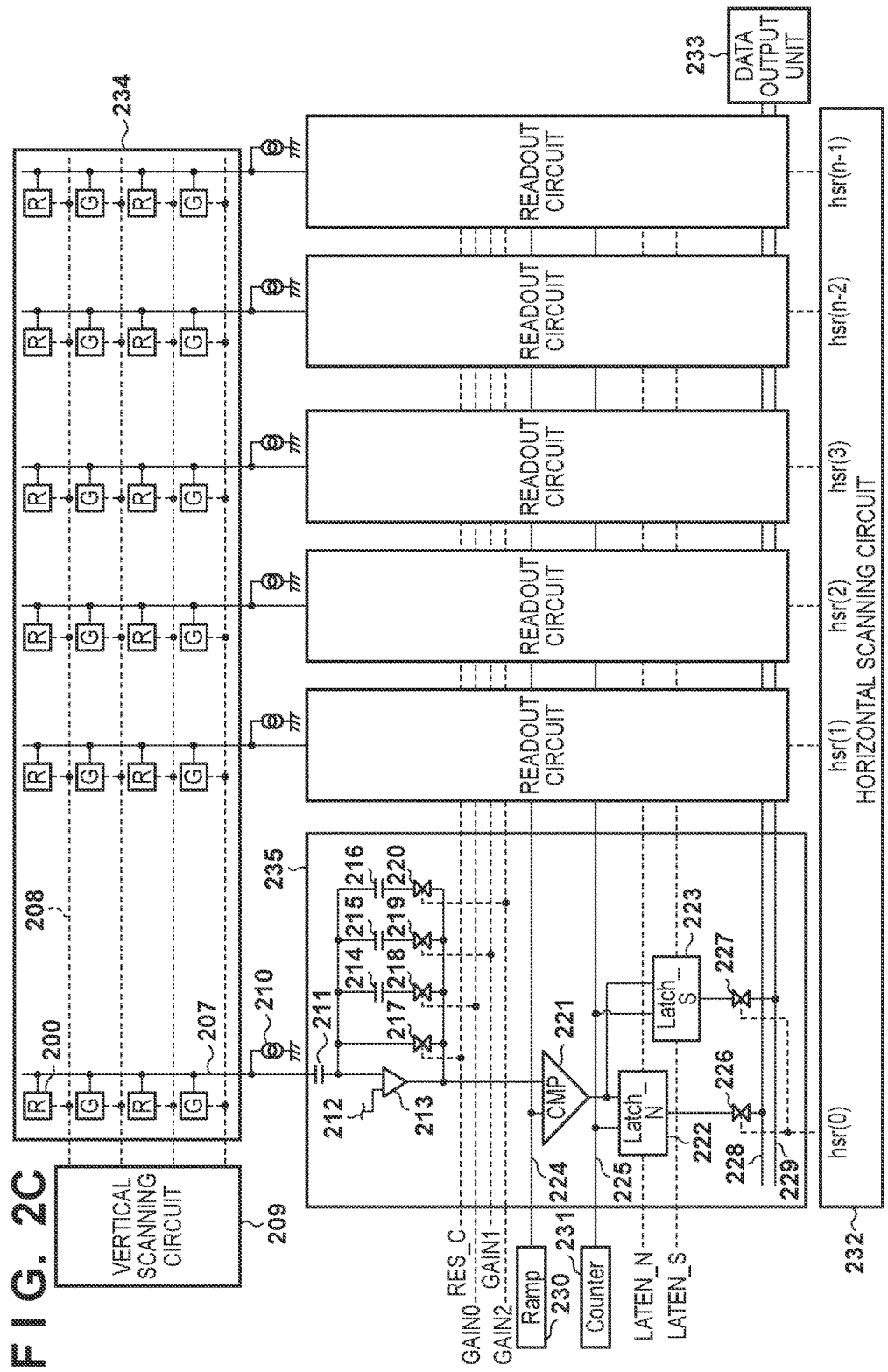
FIG. 2C is a diagram illustrating a configuration of the image sensor.

FIG. 2C is a diagram illustrating a configuration of the image sensor 14. The image sensor 14 includes a pixel array 234, a vertical scanning circuit 209, current source loads 210, readout circuits 235, common output lines 228 and 229, a horizontal scanning circuit 232, and a data output unit 233.

The pixel array 234 includes a plurality of pixels 200 that are arranged in a matrix. N pixels in a horizontal direction and 4 pixels in a vertical direction are shown in FIG. 2C for the sake of simplifying description, but the number of rows and columns of pixels 200 are arbitrary. Also, each pixel 200 is provided with a color filter of one of a plurality of colors. In the example shown in FIG. 2C, the colors of the color filters are red (R), green (G), and blue (B). These pixels 200 are arranged according to a Bayer arrangement. Also, the image sensor 14 in the present embodiment includes a region (OB) in which a portion of the pixel array 234 is shielded by a light shielding layer.

The vertical scanning circuit 209 outputs a control signal for pixels 200 on each row via the drive signal line 208 provided for each row. Note that, in FIG. 2C, one drive signal line 208 for each row is illustrated for the sake of simplification, but a plurality of drive signal lines are connected to each row, in actuality.

The pixels 200 on the same column are commonly connected to the vertical output line 207 that is provided for each column. The signal output from each pixel 200 is input to the readout circuit 235 via the vertical output line 207, and is processed in the readout circuit 235. The current source load 210 is connected to the vertical output line 207 of each column.

The horizontal scanning circuit 232 sequentially selects a column, out of the plurality of readout circuits 235, from which a signal is output, by outputting control signals hsr(0) to hsr(n−1). The readout circuit 235 of a selected column outputs a processed signal to the data output unit 233 via the common output lines 228 and 229.

Next, a specific circuit configuration of a readout circuit 235 will be described. The readout circuit 235 includes a clamp capacitor 211, feedback capacitors 214 to 216, an operational amplifier 213, a reference voltage source 212, and switches 217 to 220. The readout circuit 235 also includes a comparator 221, latches Latch_N 222 and Latch_S 223, and switches 226 and 227.

The signal input to the readout circuit 235 from the vertical output line 207 is input to an inverting input terminal of the operational amplifier 213 via a clamp capacitor 211. A reference voltage Vref is applied to a non-inverting input terminal of the operational amplifier 213 from the reference voltage source 212. The feedback capacitors 214 to 216 are connected between the inverting input terminal of the operational amplifier 213 and an output terminal. The switch 217 is also connected between the inverting input terminal of the operational amplifier 213 and the output terminal, and has a function of short-circuiting both ends of each of the feedback capacitors 214 and 216. The switch 217 is controlled by a control signal RES_C. Also, the switches 218 to 220 are respectively controlled by control signals GAIN0 to GAIN2.

An output signal of the operational amplifier 213 and a ramp signal 224 output from a ramp signal generator 230 are input to the comparator 221. The latch Latch_N 222 is a memory element for holding a noise level (N signal), and the latch Latch_S is a memory element for holding a signal level (signal S) of the signal A or a signal AB that is obtained by adding the signal A and the signal B together. The latches Latch_N 222 and Latch_S 223 are respectively controlled by control signals LATEN_N and LATEN_S, and each receive inputs of an output signal of the comparator 221 and a counter value 225 output from a counter 231. Output terminals of the latches Latch_N 222 and Latch_S 223 are respectively connected to the common output lines 228 and 229 via the switches 226 and 227. The common output lines 228 and 229 are connected to the data output unit 233.

The switches 226 and 227 are controlled by a control signal hsr(h) signal from the horizontal scanning circuit 232. Here, h indicates a column number of the readout circuit 235 to which the control signal line is connected. The signals held in the latches Latch_N 222 and Latch_S 223 are output to the outside via the common output lines 238 and 229 and the data output unit 233. This operation is referred to as horizontal transfer.

Note that the image sensor of the present embodiment has the following two types of readout modes. A first readout mode is referred to as an all-pixel readout mode, and is a mode for capturing a fine still image. In this case, signals of all pixels are read out.

A second readout mode is referred to as a thinning readout mode, and is a mode for recording a moving image or performing displaying only a preview image. Because the required number of pixels in this case is smaller than the number of all pixels, only pixels in the pixel group that are left after the thinning at a predetermined ratio in both the X and Y directions are read out. The thinning readout mode is also used similarly in the case where high-speed readout is necessary. When thinning pixels in the X direction, signals are added to achieve an improvement in the S/N ratio, and when thinning pixels in the Y direction, signals output from rows that are to be removed are ignored.

Figure 3A:
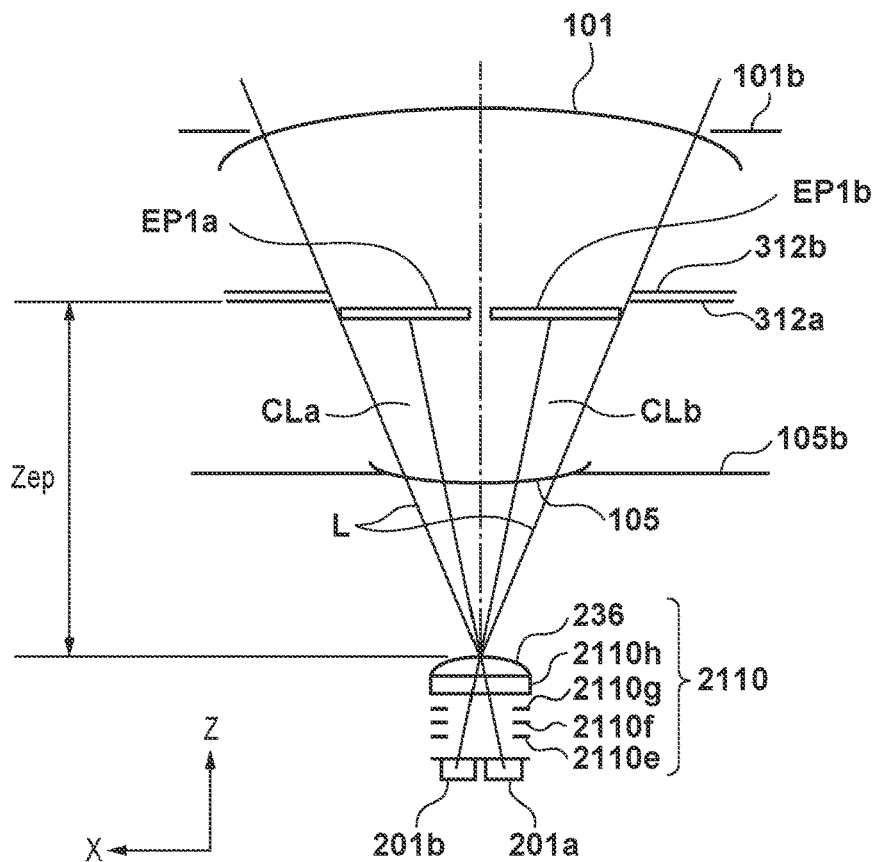
FIG. 3A is a diagram for describing a conjugate relationship between an exit pupil plane in an imaging optical system and a photoelectric conversion portion in the image sensor.
Figure 3B:
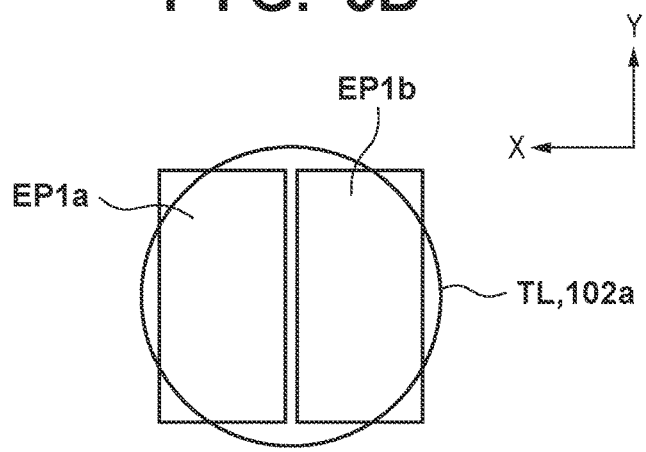
FIG. 3B is a diagram for describing a conjugate relationship between the exit pupil plane in the imaging optical system and the photoelectric conversion portion in the image sensor.

FIGS. 3A and 3B are diagrams illustrating a conjugate relationship between the exit pupil plane of the imaging optical system and the photoelectric conversion portions in the image sensor arranged at an image height of 0, that is, near the center of an image surface in the image capture apparatus in the present embodiment. The photoelectric conversion portions in the image sensor and the exit pupil plane of the imaging optical system are designed so as to have a conjugate relationship through the on-chip microlens. In general, the exit pupil of the imaging optical system roughly coincides with a plane on which an iris diaphragm for adjusting the amount of light is placed. On the other hand, the imaging optical system in the present embodiment is a zoom lens having a magnification changing function. Depending on the optical type, the distance of the exit pupil from the image surface or the size of the exit pupil changes when performing a magnification changing operation. The imaging optical system in FIG. 3A shows a state in which the focal length is at the center between a wide-angle end and a telephoto end, that is, the Middle state. Assuming this exit pupil distance Zep as a standard, optimum design of the shape of the on-chip microlens and an eccentricity parameter suitable for the image height (X and Y coordinates) is performed.

In FIG. 3A, reference numeral 101 denotes a first lens group that constitutes the lens 311, reference numeral 101b denotes a lens barrel member that holds the first lens group, reference numeral 105 denotes a third lens group that constitutes the lens 311, and reference numeral 105b denotes a lens barrel member that holds the third lens group. Reference numeral 312 denotes the aperture, reference numeral 312a denotes an aperture plate that defines the opening diameter when the aperture is fully opened, and reference numeral 312b denotes diaphragm blades for adjusting the opening diameter when the aperture is reduced. Note that reference numerals 101b, 312a, 312b, and 105b, which work as members for restricting light beams passing through the imaging optical system, each indicate an optical virtual image as observed from the image surface. A synthetic opening near the aperture 312 is defined as the exit pupil of the lens, and the distance thereof from the image surface is Zep, as mentioned above.

A pixel 2110 for performing photoelectric conversion on an object image is arranged near the center of the image surface, and will be referred to as a center pixel in the present embodiment. The center pixel 2110 is constituted by, from the lowermost layer, the photoelectric conversion portions 201a and 201b, interconnect layers 2110e to 2110g, a color filter 2110h, and the on-chip microlens 236. The two photoelectric conversion portions are projected onto the exit pupil plane of the imaging optical system by the on-chip microlens 236. In other words, the exit pupil of the imaging optical system is projected onto a surface of the photoelectric conversion portions via the on-chip microlens 236.

FIG. 3B shows projected images of the photoelectric conversion portions on the exit pupil plane of the imaging optical system, and the projected images corresponding to the photoelectric conversion portions 201a and 201b are denoted respectively by EP1a and EP1b. In the present embodiment, the image sensor has a pixel from which both an output of one of the two photoelectric conversion portions 201a and 201b and the output of the sum of the outputs of both the photoelectric conversion portions can be obtained. The output of the sum of the outputs from both the photoelectric conversion portions is obtained by performing photoelectric conversion on light beams that have passed through both areas of the projected images EP1a and EP1b, which roughly cover the entire pupil region of the imaging optical system. The projected image EP1a is referred to as a first pupil area, and the projected image EP1b is referred to as a second pupil area.

In FIG. 3A, when sign L denotes outermost portions of the light beams passing through the imaging optical system, the light beam L is restricted by the aperture plate 312a of the aperture, and vignetting substantially does not occur in the projected images EP1a and EP1b in the imaging optical system. In FIG. 3B, the light beam L in FIG. 3A is denoted by TL. It can be found that vignetting substantially does not occur, also from the fact that most of the projected images EP1a and EP1b in the photoelectric conversion portions is included within the circle denoted by TL. Since the light beam L is limited only by the aperture plate 312a of the diaphragm, TL can be replaced with 312a. At this time, vignetting states of the projected images EP1a and EP1b are symmetrical with respect to the optical axis at the image surface center, and the amount of light received by the photoelectric conversion portions 201a and 201b is equal.

As described above using FIGS. 2A to 3B, the image sensor 14 has not only a function of image capturing, but also functions as a focus detection device. Also, because a focus detection pixel that receives light beams that have passed through divided regions of the exit pupil is included, a phase difference detection method AF can be performed as a focus detection method.

Figure 4:
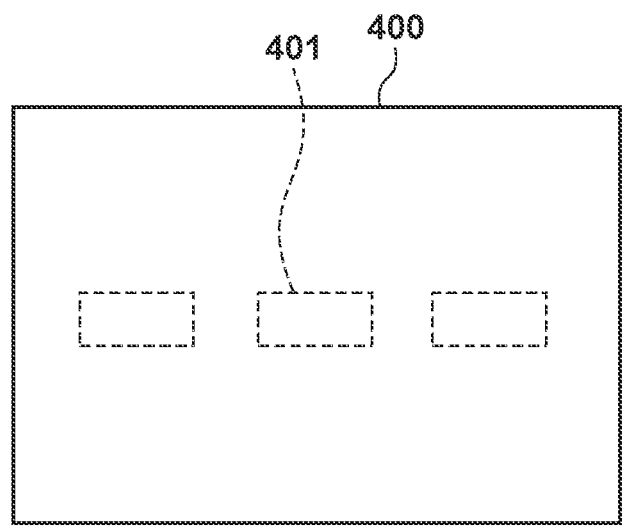
FIG. 4 is a diagram illustrating a focusing area in a shooting range.

FIG. 4 is a diagram illustrating focusing areas 401 inside a shooting range 400, and a phase difference detection method AF is executed by the image sensor 14 in these three focusing areas. Inside the focusing areas 401, the phase difference is detected using a difference in contrast in a horizontal direction inside the shooting range 400.

Note that, in the present embodiment, a description has been given in which, in the image sensor 14, one pixel includes a plurality of photoelectric conversion portions, but the method of realizing a focus detection pixel is not limited thereto. For example, a configuration may be adopted in which, in the image sensor 14, pixels including photoelectric conversion portions whose different portions are shielded are arranged as pixels dedicated to focus detection.

Figure 5:
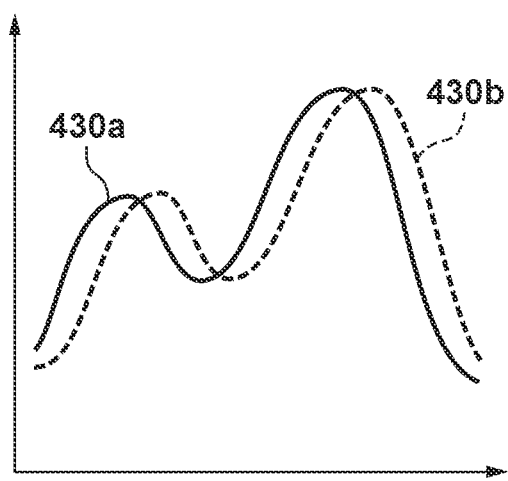
FIG. 5 is a diagram illustrating a focus detection signal in the focusing area.

FIG. 5 is a diagram illustrating a pair of focus detection signals in the present embodiment. A pair of focus detection signals 430a and 430b are signals obtained by the image processing circuit 20 performing various types of image processing (correction) on pixel signals (signals A and B) obtained from the image sensor 14. The pair of focus detection signals 430a and 430b are transmitted to the AF unit 42.

In FIG. 5, the horizontal axis indicates a direction in which pixels in each of which signals are coupled are arranged, and the vertical axis shows the signal strength. Here, a state is shown in which the focus of the imaging lens 300 is out of focus relative to the image sensor 14 (unfocused state). Therefore, the focus detection signal 430a is shifted to the left side, and the focus detection signal 430b is shifted to the right side. The AF unit 42 calculates a shift amount (relative shift amount) of the focus detection signals 430a and 430b using a known correlation operation or the like. With this, a defocus amount indicating the focus condition of the imaging optical system can be obtained.

The system control circuit 50 calculates a driving amount of the focus lens based on information regarding the position of the focus lens in the lens 311 transmitted from the lens system control circuit 346 and a defocus amount obtained from the AF unit 42. Thereafter, the system control circuit 50 transmits information regarding the position to which the focus lens is to be driven based on the information regarding the position of the focus lens in the lens 311 to the lens system control circuit 346 and the focus control unit 342. Accordingly, focus adjustment can be performed.

Figure 6:
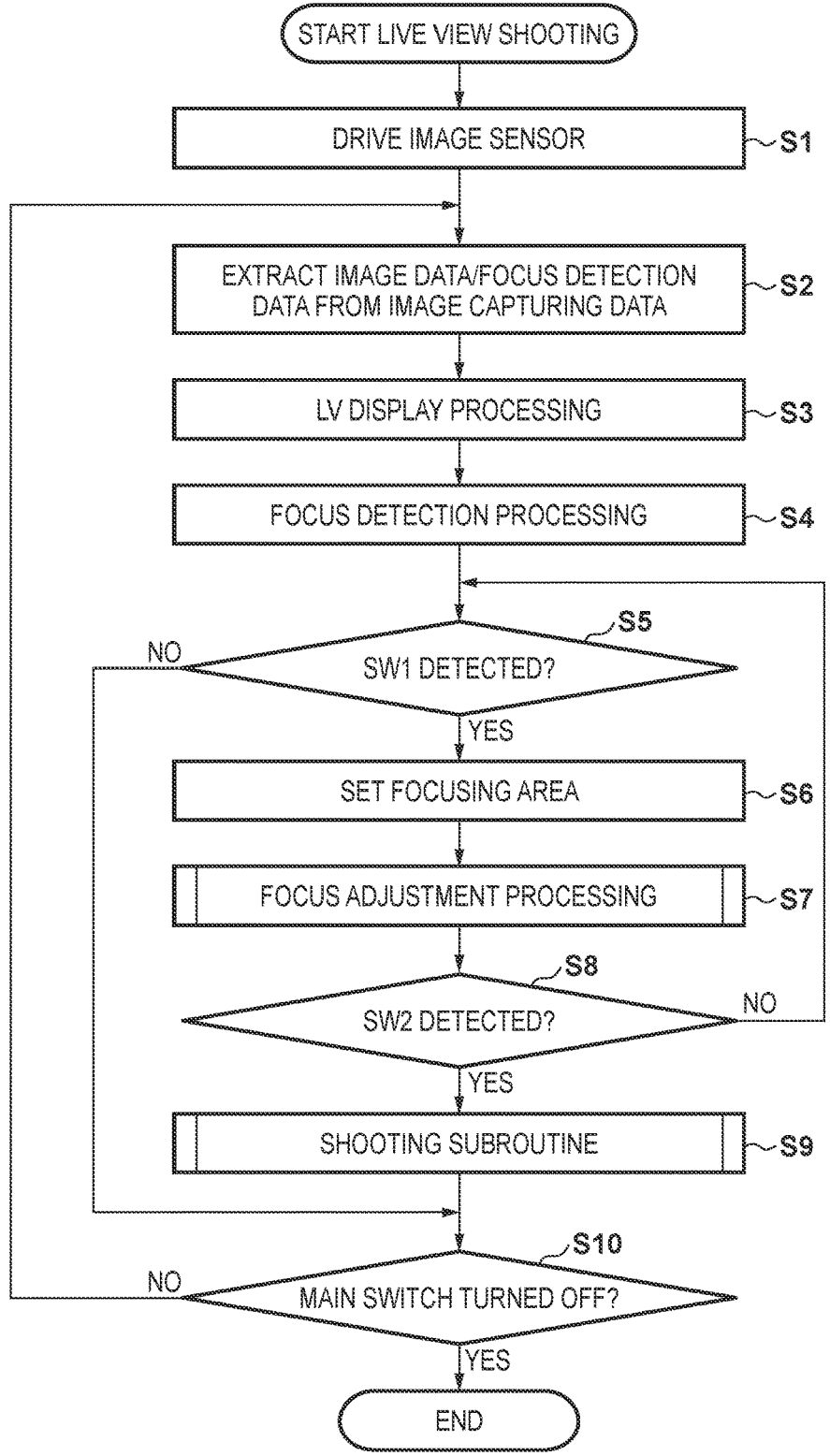
FIG. 6 is a flowchart illustrating focus adjustment and shooting operations of a camera.

Next, FIG. 6 is a flowchart illustrating operations of the camera 100 in the present embodiment, and shows the main flow when shooting is performed in a live view state of the camera 100. Steps in FIG. 6 are to be executed mainly based on instructions from the system control circuit 50.

In FIG. 6, when live view shooting is started, first in step S1, the system control circuit 50 starts an image capturing operation of the image sensor 14, and acquires image capturing data (pixel signal). Next, in step S2, the system control circuit 50 acquires image data (image signal) and focus detection data (focus detection signal) from the image capturing data obtained in step S1. As described above, the image sensor 14 of the present embodiment can acquire data of the focus detection signal in addition to data of the image signal from one pixel.

Next, in step S3, the system control circuit 50 performs a so-called live view display in which a preview image is displayed in the image display unit 28 based on the image data obtained in step S2. A photographer determines the composition at shooting while viewing this preview image. The live view display performed here is for the photographer to confirm the shooting range and the shooting condition, and is updated at predetermined time intervals. For example, the live view display is updated at time intervals of 33.3 ms (30 fps) or 16.6 ms (60 fps).

Next, in step S4, the system control circuit 50 (AF unit 42) performs focus detection processing using focus detection data of the three focusing areas shown in FIG. 4. That is, the AF unit 42 performs processing in which the defocus amount is calculated based on a shift amount of the focus detection signals, as shown in FIG. 5, as focus detection processing.

Next, in step S5, the system control circuit 50 detects ON/OFF of the switch SW1 that indicates starting the shooting preparation. A shutter switch (shooting trigger switch), which is one of the operation members of the operation unit 70, can detect ON/OFF in two levels according to the pressing amount of the switch. A switch SW1 is configured to be turned on when ON of the shutter switch in the first level is detected. In step S5, if ON of the switch SW1 is not detected, the processing advances to step S10. In step S10, the system control circuit 50 determines whether or not a main switch is turned off. If the main switch is not turned off, the processing returns to step S2. On the other hand, if the main switch is turned off, this flow is ended.

On the other hand, in step S5, if ON of the switch SW1 is detected, the processing advances to step S6. In step S6, the system control circuit 50 sets a focusing area. The focusing area can be set to a focusing area instructed by the photographer. Alternatively, a configuration may be adopted in which the system control circuit 50 automatically sets the focusing area using information regarding the defocus amounts of the three focusing areas obtained in step S4 or information regarding a distance of the focusing area from a center of the shooting range. In general, it is highly possible that the object intended by the photographer exists at a position at which the shooting distance is shorter, and at the center of the shooting range. Therefore, in the case where the system control circuit 50 sets the focusing area, it is preferable that such a focusing area is preferentially selected.

Next, in step S7, the system control circuit 50 (AF unit 42) performs focus adjustment processing. The details of the focus adjustment processing in step S7 will be described later. When the focus adjustment processing in step S7 is ended, the processing advances to step S8.

In step S8, the system control circuit 50 detects ON/OFF of the switch SW2, which makes an instruction to start shooting. The shutter switch, which is one of the operation members of the operation unit 70, can detect ON/OFF in two levels according to the pressing amount of the switch. A switch SW2 is configured to be turned ON when ON of the shutter switch in the second level is detected. In step S8, if ON of the switch SW2 is not detected, the processing returns to step S5, and ON/OFF of the switch SW1 is detected. On the other hand, in step S8, if ON of the switch SW2 is detected, the processing advances to step S9. In step S9, the system control circuit 50 executes a shooting subroutine. The detail of the shooting subroutine in step S9 will be described later.

When the shooting subroutine is ended in step S9, the processing advances to step S10. In step S10, the system control circuit 50 determines whether or not the main switch is turned off. If the main switch is not turned off, the processing returns to step S2. On the other hand, if the main switch is turned off, the series of operations in this flow is ended.

Figure 7:
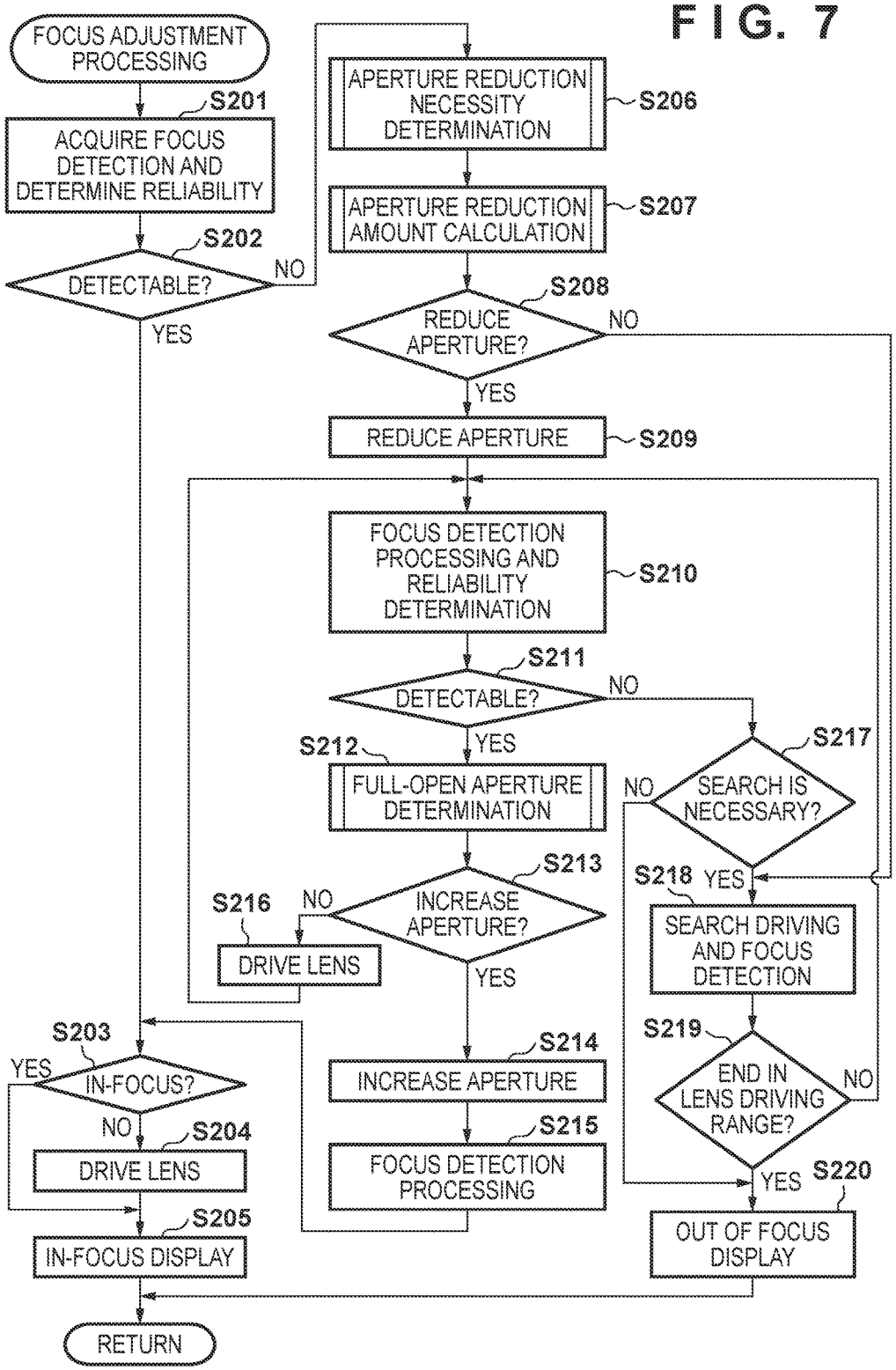
FIG. 7 is a flowchart illustrating a subroutine of the focus adjustment.

Next, the focus adjustment processing in step S7 in FIG. 6 will be descried with reference to FIG. 7. FIG. 7 is a flowchart illustrating the focus adjustment processing. Steps in FIG. 7 are to be executed mainly based on instructions from the system control circuit 50.

When the focus adjustment processing is started, in step S201, the system control circuit 50 acquires a result of focus detection performed in advance. Note that the focus detection performed in advance in a live view state has been performed at full-open aperture. The defocus amount in the focusing area set in steps S4 and S6 in FIG. 6 is acquired. Also, whether or not the reliability of the obtained defocus amount is high is determined at the same time. The determination of reliability is performed by the system control circuit 50 which serves as reliability determination means. Specifically, a known determination using the size of a minimal value of a correlation amount and the size of a difference of correlation amounts in the vicinity of the minimal value, or the like, is performed as the determination of reliability.

The correlation amount indicates a correlation degree for each region of a pair of focus detection signals, and takes a smaller value as the correlation increases. Therefore, regarding the minimal value of a correlation amount COR, it is determined that the reliability is higher the smaller the minimal value is. Ideally, the minimal value of the correlation amount COR is 0 when a pair of the focus detection signals have completely the same shape. However, a pair of the focus detection signals have different shapes due to diffusion characteristics of light from the object, a light amount adjustment error, influence of noise that is generated in each pixel, and the like. Therefore, the minimal value of the correlation amount COR takes a positive value, in general. On the other hand, as the difference between the shapes of a pair of focus detection signals increases, the detection accuracy of the minimal value degrades, and as a result, the focus detection accuracy degrades. In the reliability determination performed here, it is determined that the reliability is high if the minimal value of the correlation amount COR is smaller than a threshold value Thr1, as one method.

Also, a reliability determination is performed using a difference DCOR of correlation amounts obtained in the vicinity of region at which the correlation amount takes a minimal value. The larger the difference DCOR of correlation amounts, the higher the calculation accuracy of the shift amount. This is because, even if the correlation amounts vary due to errors, if the difference of correlation amounts is large, the influence of the variation on the detection of the shift amount is small. Accordingly, if the difference DCOR of correlation amounts is larger than a threshold value Thr2, it can be determined that the reliability is high.

Next, in step S202, it is determined whether or not a defocus amount having high reliability is detected. If a defocus amount having high reliability is detected, the processing advances to step S203, and it is determined whether or not the detected defocus amount is less than or equal to a predetermined threshold value, that is, whether or not a focused state was achieved. If it is determined that a focused state was not achieved, the determination in step S203 is No, the processing advances to step S204, and the focus lens is driven based on the detected defocus amount.

In step S203, if the detected defocus amount is less than or equal to the predetermined threshold value, and it is determined that a focused state was achieved (Yes in S203), the processing advances to step S205, and a message of in-focus is displayed in the image display unit 28. For example, the frame corresponding to the focusing area is displayed in a green color, or a sound is output.

On the other hand, in step S202, it is determined that a defocus amount having high reliability is not detected, the processing advances to step S206, and the system control circuit 50, which is aperture state change necessity determination means, performs aperture reduction necessity determination. In the present embodiment, in the case where a defocus amount having high reliability cannot be detected in a full-open aperture state (first aperture opening state), the aperture is reduced so as to be shifted to a second aperture opening state. Accordingly, the detectable defocus range increases, the frequency of a lens being driven in a wrong direction is reduced, and high speed focus adjustment can be realized. However, in the case where, even in the second aperture opening state in which the aperture has been reduced, the focus detection is impossible, the responsiveness of focus adjustment is degraded by an amount of time required to reduce the aperture. In step S202, the necessity of aperture reduction is determined in order to reduce the frequency of unnecessary aperture reduction. The details will be described later.

When the aperture reduction necessity determination is ended, the processing advances to step S207, and an aperture reduction amount is calculated. Since it takes a certain amount of time to perform aperture reduction, as described above, a minimum necessary aperture reduction amount is detected and driving is performed, and as a result, the reduction in responsiveness in focus adjustment by aperture reduction can be minimized. In the present embodiment, an optimum aperture reduction amount is calculated in step S207. In the case where aperture reduction is determined as unnecessary in step S206, step S207 may be skipped.

Next, in step S208, it is determined whether or not the aperture is to be reduced based on the determination result in step S206. If the aperture is to be reduced (Yes in S208), the processing advances to step S209, and the aperture is driven based on the aperture reduction amount calculated in step S207. Thereafter, the processing advances to step S210, and focus detection processing is performed. The processing performed here is similar to the processing performed in step S4 in FIG. 6. Also, the reliability of focus detection is determined at the same time.

When the focus detection processing in step S210 is ended, the processing advances to step S211, and it is determined whether or not a defocus amount having high reliability was obtained. If a defocus amount having high reliability was obtained (Yes in S211), the processing advances to step S212, and determination as to whether or not the aperture is fully open is performed. When the aperture is reduced (second aperture opening state), the detectable defocus amount is large relative to that when the aperture is fully opened (first aperture opening state), and as a result, even if the focus lens is driven faster, the risk of passing through the in-focus position is small. In step S212, because a lens is driven in a state (second aperture opening state) in which the aperture is reduced until the detected defocus amount becomes less than or equal to a predetermined threshold value, it is determined whether or not the aperture is to be fully opened.

In step S213, it is determined whether or not the aperture is to be opened or not based on the determination result in step S212. If the aperture is to be opened, the processing advances to step S214, and the aperture is driven to the full-open state (first aperture opening state). Thereafter, the processing advances to step S215, and focus detection processing is performed similarly to step S4 in FIG. 6. When the focus detection processing in step S215 is ended, the processing in step S203 onward is performed similarly to the above-described case.

On the other hand, in step S213, if it is determined that the aperture is not to be opened, the processing advances to step S216, and the focus lens is driven based on the defocus amount detected in step S210. When the processing in step S216 is ended, the processing returns to step S210, and the focus detection processing in the second aperture opening state is subsequently performed.

If a defocus amount having high reliability is not obtained in step S210, the determination in step S211 is No, and the processing advances to step S217. In step S217, it is determined whether or not search driving is necessary, before determining "out of focus". In the present embodiment, focus detection is performed in both the first aperture opening state and the second aperture opening state. There are cases where it can be determined that the possibility of being able to shift to an in-focus state is small even if the search driving is performed, based on signals and evaluation values that are obtained when focus detection is performed. For example, in the case where a difference in brightness (contrast) in the focus detection signal does not change before and after the aperture is reduced, and the like, the possibility of shifting to an in-focus state is low even if search driving is performed, and it is determined that the search driving need not be performed. Alternatively, if a change in a predetermined frequency component of an object signal or the like is detected, it may be determined that the search driving is unnecessary if the change is small. The reason why such determination is possible is because the change in aperture mainly affects only the focal depth with respect to an object light beam. When the aperture is reduced, the focal depth with respect to the object light beam increases, the difference in brightness in the focus detection signal increases, and the signal amount of a predetermined frequency component increases, and as a result, the detectable defocus amount increases. To the contrary, in the case where a change in the difference in brightness and the signal amount of the focus detection signal is small, it is estimated that a pattern of an object having high contrast did not exist in the focusing area from the start. Utilizing this fact, in step S217, it is determined whether or not searching is necessary.

In step S217, if it is determined that the search is not necessary, the processing advances to step S220, and a message indicating "out of focus" is displayed in the image display unit 28. For example, the frame corresponding to the focusing area is displayed in a red color, or a sound that is different from that when a message indicating "in focus" is displayed is output.

On the other hand, in step S217, if it is determined that searching is necessary, the processing advances to step S218, the search driving is started, and the focus detection processing is performed while lenses are driven. The focus detection processing performed here is similar to the processing performed in step S4 in FIG. 6. When the focus detection is ended in step S218, in step S219, it is determined whether or not the focus lens has reached an end portion in a lens driving range. If the focus lens has not arrived at the end portion of the lens driving range, the processing returns to step S210, and the focus detection processing and the search driving are continued. In step S219, if the focus lens has arrived at the end portion of the lens driving range, it is determined that an object on which focusing is possible does not exist in the lens driving range, the processing advances to step S220, and a message indicating "out of focus" is displayed. In step S219, the processing may advance to step S220 when both ends of the lens driving range are detected, or an end portion on a close end side in a range in which focusing on an object is possible is detected, for example. Whether only one end portion is to be detected or both end portions are to be detected may be switched based on a lens end determination result, which will be described later, using a detectable defocus amount.

On the other hand, in step S208, if it is determined that the aperture is not to be reduced, the processing advances to step S218, and the search driving is performed. The operations in step S218 onward are similar to those described above.

When the display indicating in focus in step S205 or the display indicating out of focus in step S220 is ended, the subroutine of the focus adjustment processing is ended. In the present embodiment, the processing flow in the case where a still image is shot has been described. On the other hand, when a moving image is being shot, changes in the F-number affects images to be recorded, and therefore the aperture reduction may be prohibited.

Figure 8:
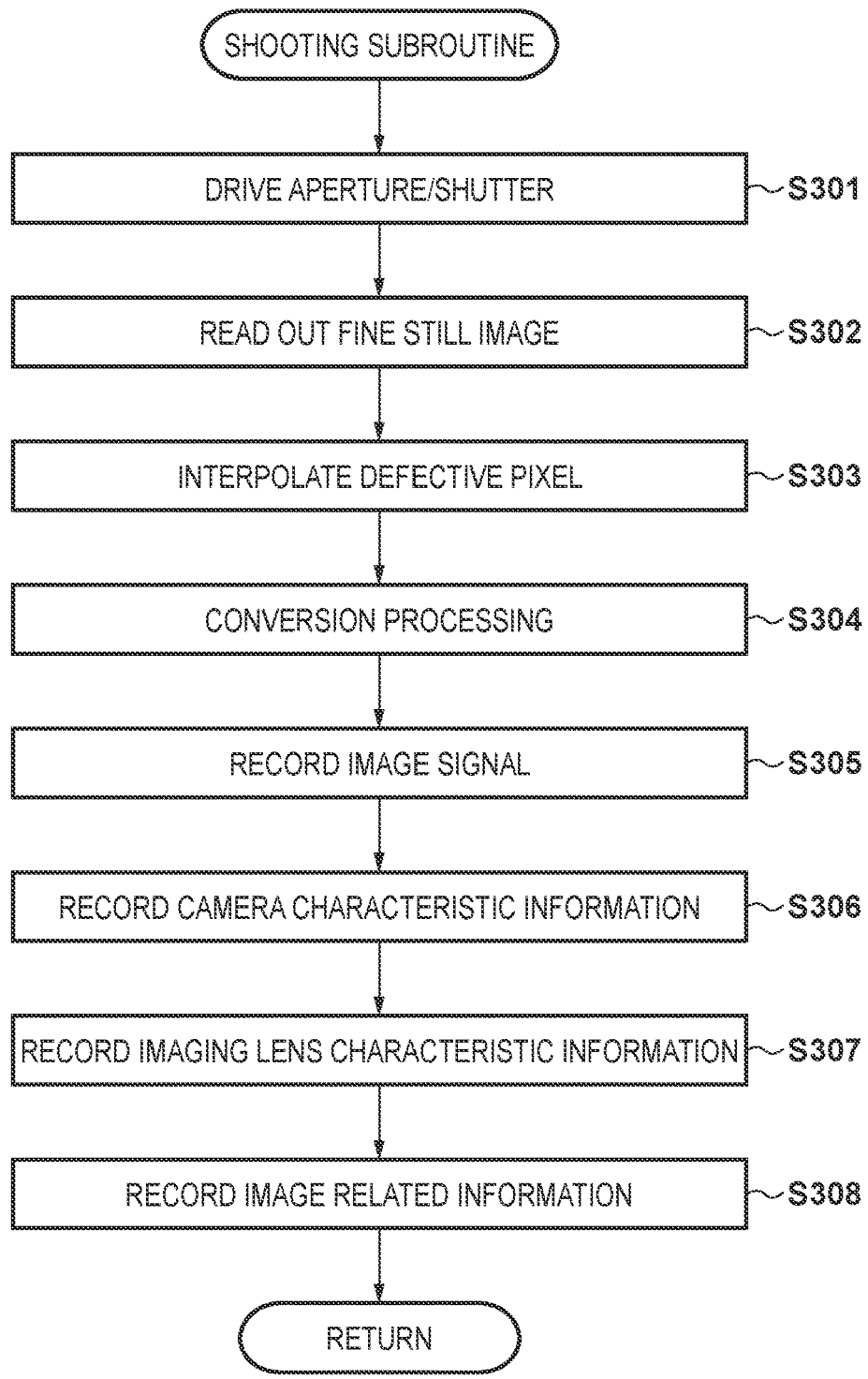
FIG. 8 is a flowchart illustrating a subroutine of shooting.

Next, the shooting subroutine in step S9 in FIG. 6 will be described using FIG. 8. FIG. 8 is a flowchart illustrating the shooting subroutine. Steps in FIG. 8 are to be executed mainly based on instructions from the system control circuit 50.

First, in step S301, the system control circuit 50 drives the aperture for adjusting the light amount, and performs control on the shutter 12 that defines exposure time (aperture/shutter driving). Accordingly, an image is captured. Next, in step S302, the system control circuit 50 performs image readout for shooting a fine still image, that is, all pixels are read out. Next, in step S303, the system control circuit 50 (image processing circuit 20) interpolates a defective pixel in the read image signal. The interpolation is performed based on position information of defective pixels that are recorded in advance. The defective pixels include a pixel in which a variation in output offset and gain relative to other pixels is large, a separately arranged focus detection pixel, and the like. Next, in step S304, image processing such as γ correction, color conversion, and edge enhancement is performed on the image signal, and a shot image (image signal subjected to image processing) is obtained. Then, in step S305, the system control circuit 50 stores the shot image in the memory 30.

Next, in step S306, the system control circuit 50 stores characteristic information of the camera 100 in the memory 30 and a memory in the system control circuit 50 so as to be associated with the shot image stored in step S305. The characteristic information of the camera 100 includes exposure time information, image processing information when development is performed, information regarding light reception sensitiveness distribution in pixels in the image sensor 14, vignetting information of the shooting light beam inside the camera 100, and the like. Also, the characteristic information of the camera 100 includes information regarding the distance from an attachment face between the camera 100 and the imaging lens 300 to the image sensor 14, manufacturing error information, and the like. The information regarding light reception sensitiveness distribution in pixels in the image sensor 14 is determined by the on-chip microlens 236 and the photodiodes 201a and 201b, and therefore information thereof may be stored.

Next, in step S307, the system control circuit 50 stores characteristic information of the imaging lens 300 in the memory 30 and the memory in the system control circuit 50 so as to be associated with the shot image stored in step S305. The characteristic information of the imaging lens 300 includes information regarding the exit pupil, frame information, information regarding the focal length and the F-number when shooting is performed, aberration information, manufacturing error information, and the like, for example. Next, in step S308, the system control circuit 50 stores image related information regarding the shot image in the memory 30 and the memory in the system control circuit 50. The image related information includes information regarding the focus detection operation before shooting, object movement information, information relating to accuracy of the focus detection operation, and the like. When step S308 is ended, the shooting subroutine in step S9 in FIG. 6 is ended, and the processing advances to step S10 in the main routine.

Figure 9:
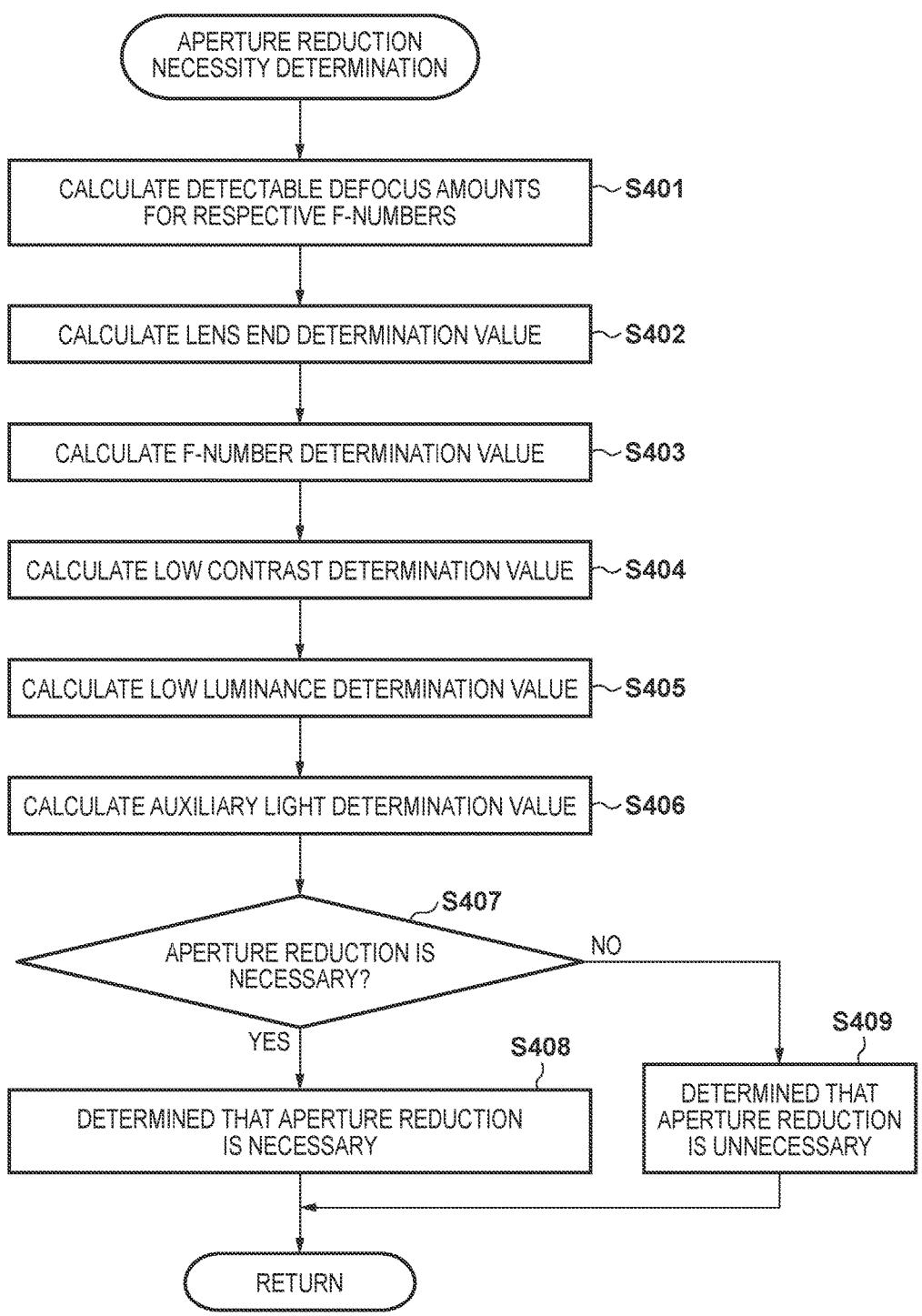
FIG. 9 is a flowchart illustrating a subroutine of necessity determination as to whether or not the aperture needs to be decreased.

Next, the aperture reduction necessity determination in step S206 in FIG. 7 will be described using FIG. 9. FIG. 9 is a flowchart illustrating the subroutine of the aperture reduction necessity determination. Steps in FIG. 9 are to be executed mainly based on instructions from the system control circuit 50.

First, in step S401, detectable defocus amounts for respective F-numbers in the selected focusing area are calculated. As described in FIG. 3A, the degree of vignetting of the image projected on the photoelectric conversion portion changes according to the F-number, and the angle difference between light beams passing through two different pupil areas, that is, the base line length changes accordingly. As the aperture decreases, the base line length decreases, and the image shift amount with respect to unit defocus amount decreases. Also, because the influence of vignetting by the imaging optical system changes based on the position (image height) of the focusing area in the image sensor, the base line length changes. In the present embodiment, detectable defocus amounts for respective F-numbers are calculated considering the F-number of the imaging optical system and the image height of the focusing area. For example, in the case of a lens whose full-open aperture is F 2.8, the detectable defocus amounts for F 4.0, F 5.6, and F 8.0 are calculated in the step of one stop. The detectable defocus amounts are stored for respective F-numbers in the step of Fδ, conversion is performed with respect to the base line length so as to calculate the desired detectable defocus amount. As the base line length decreases, variation in detecting the shift amount between a pair of images increases. As a result, because the detectable defocus amount decreases, conversion is performed such that the detectable defocus amount increases and decreases in accordance with an increase and decrease in the base line length.

Also, the range of F-numbers with respect to which the detectable defocus amount is to be calculated may be limited to the range from full-open aperture to a predetermined F-number. As described above, as the aperture decreases, the base line length decreases, and variation in focus detection increases. Therefore, if the F-number becomes excessively large, the detectable defocus amount does not increase. In the present embodiment, an upper limit of the F-number is provided in a range in which the detectable defocus amount increases due to aperture reduction.

Next, in step S402, a lens end determination value is calculated. First, the defocus amounts from the current focus lens position to the infinity end and the close end in the lens movable range are acquired. If the defocus amount to the end portion (end portion N) of the smaller defocus amount is smaller than the detectable defocus amount at the current F-number obtained in step S401, it is judged that an object does not exist in a region from the current focus lens position to the end portion N. Accordingly, it can be determined that the lens driving direction is a direction opposite to the direction toward the end portion N, and as a result, it is judged that the aperture reduction is unnecessary.

Next, in step S403, the difference between the current F-number and the F-number in a state in which the aperture is reduced is determined. If the amount of increase in the detectable defocus amount at the F-number in the state in which the aperture is reduced relative to the detectable defocus amount at the current F-number is not larger than a predetermined amount, disadvantages due to the time required to reduce the aperture increase. Therefore, in step S403, if the difference between the detectable defocus amount at the current F-number and that at the F-number when the aperture is minimized is smaller than a predetermined value, it is judged that aperture reduction is unnecessary.

Next, in step S404, a low contrast determination value is calculated. When the contrast (difference in brightness) of the focus detection signal is smaller than a predetermined value, there are cases where an increase in the detectable defocus amount due to aperture reduction will not be expected. For example, when the object is an edge portion that includes a white portion and a black portion that each have an area larger than or equal to a predetermined amount, the change in F-number affects the change in a blur state of the object optical image, but does not affect the contrast. Therefore, in the case of an object signal whose contrast is low, and in which the change in brightness is small, low contrast is determined, and it is judged that aperture reduction is unnecessary.

Next, in step S405, a low luminance determination value is calculated. When the environment in which shooting and focus adjustment are performed is of low luminance, there are cases where the frame rate will be reduced and the exposure time will be increased in order to make the object recognizable in the live view display that is displayed in the image display unit 28, and in order to secure the light amount in the focus detection signal. In such a case, when the aperture is reduced, the light amount is further reduced, which has an adverse effect. In step S405, if the photometric amount obtained by the photometry unit 46 is less than a predetermined amount, it is judged that aperture reduction is unnecessary.

Next, in step S406, an auxiliary light determination value is calculated. The auxiliary light is supplementarily emitted in order to resolve the problem caused by insufficient contrast and brightness when focus adjustment is performed such that the focus adjustment is made possible. Therefore, similarly to step S405, in the case where the aperture is reduced when the auxiliary light is emitted, a disadvantage caused by the reduction in the light amount is large. In step S406, if the auxiliary light is to be emitted, it is determined that aperture reduction is unnecessary.

Next, in step S407, if it has been judged that aperture reduction is unnecessary in any of the judgements performed in steps S402 to S406 as to whether or not aperture reduction is necessary, the processing advances to step S409, and it is determined that aperture reduction is unnecessary. On the other hand, if it has been judged that aperture reduction is necessary in all the judgements performed in steps S402 to S406, the processing advances to step S408, it is determined that aperture reduction is necessary. When the determination as to whether or not aperture reduction is necessary is ended in step S408 or S409, the subroutine of the aperture reduction necessity determination is ended, and the processing advances to step S207 in FIG. 7.

In the present embodiment, it is determined whether or not aperture reduction is necessary after all the determination conditions with respect to the aperture reduction necessity are considered, but whether or not aperture reduction is necessary may be determined in each determination step. Accordingly, the calculation of an unnecessary determination value can be omitted.

Figure 10:
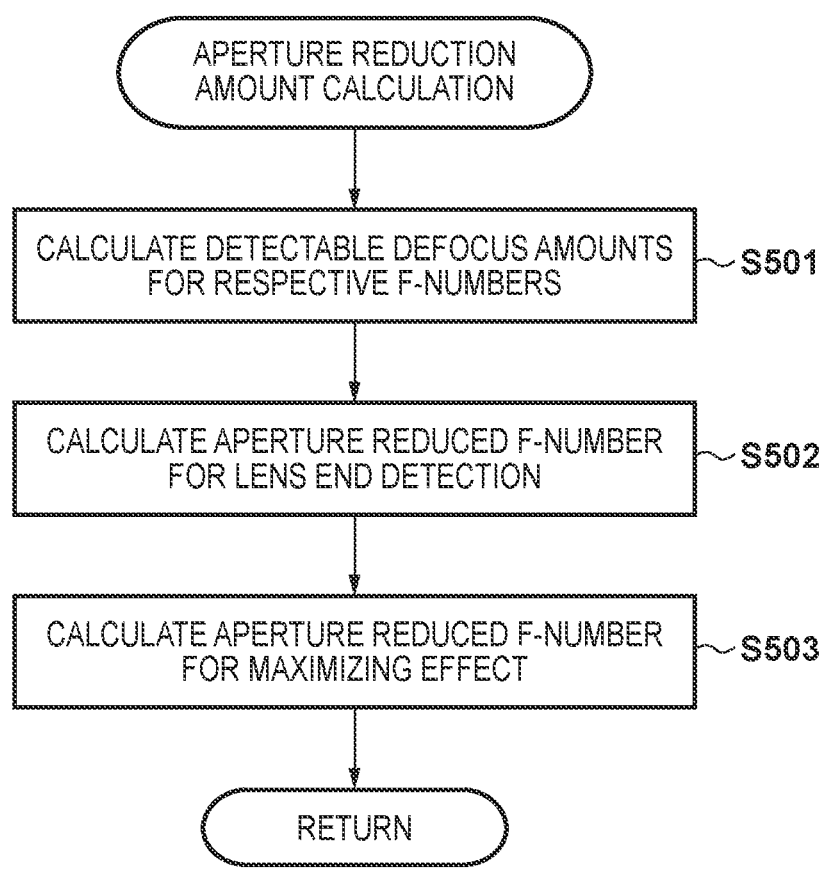
FIG. 10 is a flowchart illustrating a subroutine of calculating an amount of aperture reduction.

Next, the aperture reduction amount calculation in step S207 in FIG. 7 will be described using FIG. 10. FIG. 10 is a flowchart illustrating a subroutine of the aperture reduction amount calculation. Steps in FIG. 10 are to be executed mainly based on instructions from the system control circuit 50.

In step S501, similarly to step S401, the detectable defocus amount for each F-number in the selected focusing area is calculated. Since the processing is similar, the description will be omitted. Next, in step S502, the F-number to which the aperture is to be reduced for lens edge detection is calculated. First, the defocus amounts from the current focus lens position to the infinity end and the close end in the lens movable range are acquired. An aperture with which the detectable defocus amount increases relative to the defocus amount to the end portion (end portion N) at which the defocus amount is smaller is searched for under the conditions of the F-numbers calculated in step S501. The F-number with which the change amount in F-number is smallest among the available aperture conditions is calculated as an aperture reduced F-number.

Next, in step S503, an aperture reduced F-number with which the effect of responsiveness improvement in focus adjustment by the aperture reduction is appropriately obtained is calculated. As described above, it takes a certain amount of time to reduce the aperture, but the frequency of wrong judgement in terms of a lens drive direction can be reduced, and speed of the lens drive when search driving is performed can be increased. The aperture reduced F-number needs to be appropriately set considering disadvantages and expected effects. In the present embodiment, the F-number is determined as follows from a defocus amount D (maximum defocus amount) from the infinity end to the close end, a lens drive speed Vf at the aperture reduced F-number, a lens drive speed V0 at the current F-number, and time T required for the aperture reduction.

$$D/V0 - D/Vf > k \times T \qquad \text{Equation 1}$$

The determination is performed by changing the lens drive speed for each F-number, and the F-number at which the change in F-number is smallest, among the F-numbers that satisfy Equation 1, is calculated as the aperture reduced F-number. k is a constant, and may be set in advance such that appropriate determination will be performed. In Equation 1, it is determined that the effect of reduction in lens drive time is greater than the demerit of the increase in the time required to reduce the aperture.

When the processing in step S503 is ended, the F-number having the smallest value of the F-numbers calculated in steps S502 and S503 is set as the aperture reduced F-number, and the subroutine for calculating the aperture reduction amount is ended. In the present embodiment, as a result of minimizing the aperture reduction amount in a range in which an effect of the aperture reduction can be obtained, the time required to reduce the aperture can be reduced.

Next, the determination as to whether or not the aperture is fully opened in step S212 in FIG. 7 will be described using FIG. 11. FIG. 11 is a flowchart illustrating a subroutine of determining whether or not the aperture is to be fully opened. Steps in FIG. 11 are to be executed mainly based on instructions from the system control circuit 50.

In step S601, information regarding the focusing area is acquired. Information regarding whether the focusing area is a region whose position is fixed in a shooting range selected by the photographer, or a region, such as a person's face, whose position changes in the shooting range based on an object detection result is acquired. It is not assured that the object detection that was possible in a state in which the aperture was reduced is also possible in a more blurred state due to the aperture being fully opened. In the present embodiment, in the case where the camera automatically detects and sets the focusing area, even in a case where the aperture is driven to the full-open state, control is performed such that object detection and focusing area setting can be continuously performed.

In step S602, a threshold value for the defocus amount when the aperture is to be fully opened is set. In the case where the focusing area is set by object detection or the like, the defocus amount, which serves as the threshold value, is set smaller relative to the case where the focusing area is fixed. Next, in step S603, it is determined whether or not the defocus amount obtained in step S210 is less than or equal to the threshold value. If the defocus amount is less than or equal to the threshold value, the processing advances to step S604, and it is determined that the aperture needs to be opened. If the defocus amount is larger than the threshold value, the processing advances to step S605, and it is determined that the aperture is kept at the current state. When the determination as to whether or not the aperture is to be fully opened is ended in step S604 or step S605, the subroutine for determining whether or not the aperture is to be fully opened is ended.

In the present embodiment, the subroutine for determining whether or not the aperture is to be fully opened has been described assuming that even in a state in which the aperture is reduced, object detection and designation of the tracking start position of a focusing area by a photographer are possible. However, a configuration may be adopted in which, when the aperture is reduced, processing such as setting or changing the focusing area or object detection will not be performed. Accordingly, the load on computational processing can be reduced. Also, the determination as to whether or not the aperture is to be fully opened may be configured such that the aperture is changed to a full-open state in a case where, in a state in which the aperture is reduced, the state is transitioned from a state in which focus detection is possible to a state in which focus detection is not possible.

In the above-described embodiment, a case where one focusing area is set has been described. However, a plurality of focusing areas may be set at the same time. In such a case, determination as to whether or not the aperture needs to be reduced may be performed if the focus detection is impossible in all the focusing areas. Alternatively, priority is set in which, among a plurality of focusing areas, the focusing area closest to the center is prioritized, for example, and determination as to whether or not the aperture needs to be reduced and the like may be performed if the focus detection is impossible in a focusing area with high priority.

Although preferred embodiments of the present invention have been described above, the present invention is not limited to these embodiments, and various modifications and changes can be made without departing from the spirit of the invention.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-061883, filed Mar. 27, 2017 which is hereby incorporated by reference herein in its entirety.

What is claimed is:
1. An image capturing apparatus comprising:
at least one processor or circuit configured to function as the following units:
a focus detection unit configured to detect a focus state of an imaging optical system;
a reliability determination unit configured to determine reliability of the focus detection; and a control unit configured to control an opening of an aperture of the imaging optical system,
wherein the control unit,
if the reliability determination unit determines that reliability of the focus detection performed in a state in which the opening of the aperture is controlled to a first aperture opening state is less than a threshold value,
changes the aperture to a second aperture opening state in which the opening of the aperture is reduced relative to the first aperture opening state, and
wherein the control unit does not change the aperture to the second aperture opening state if a predetermined condition is satisfied.

2. The image capturing apparatus according to claim 1, wherein the at least one processor or circuit is configured to further function as a focus adjustment unit configured to perform focus adjustment by driving a focus lens in the imaging optical system based on a result of focus detection performed by the focus detection unit.

3. The image capturing apparatus according to claim 2, wherein, when the aperture is to be changed to the second aperture opening state, the aperture control unit changes the aperture to the second aperture opening state, and the focus detection unit performs the focus detection in the second aperture opening state.

4. The image capturing apparatus according to claim 3, wherein the focus adjustment unit drives the focus lens based on a result of the focus detection performed in the second aperture opening state.

5. The image capturing apparatus according to claim 2, wherein drive speed of the focus lens in the second aperture opening state is faster than a drive speed of the focus lens in the first aperture opening state.

6. The image capturing apparatus according to claim 2, wherein the at least one processor or circuit is configured to further function as a calculation unit configured to calculate an amount of reduction of the aperture when the aperture is to be changed from the first aperture opening state to the second aperture opening state, based on information regarding time it takes for the focus adjustment unit to perform focus adjustment.

7. The image capturing apparatus according to claim 6, wherein the information regarding time it takes to perform focus adjustment is at least one of information regarding a maximum defocus amount with respect to which the focus adjustment unit can adjust focus, information regarding a defocus amount to an end in a range in which the focus adjustment unit can adjust focus, and information regarding drive speed of the focus lens.

8. The image capturing apparatus according to claim 2, wherein, if a defocus amount to an end in a range in which the focus adjustment unit can adjust focus is less than a second predetermined value, the aperture is not changed to the second aperture opening state.

9. The image capturing apparatus according to claim 1, wherein, if a difference in brightness between a pair of image signals is less than a third predetermined value, the aperture is not changed to the second aperture opening state.

10. The image capturing apparatus according to claim 1, wherein the at least one processor or circuit is configured to further function as a photometry unit configured to measure brightness of an object,
wherein, if it is determined, by the photometry unit, that brightness of an object is less than a fourth predetermined value, the aperture is not changed to the second aperture opening state.

11. The image capturing apparatus according to claim 1, wherein, if a moving image is being shot, the aperture is not changed to the second aperture opening state.

12. The image capturing apparatus according to claim 1, wherein the at least one processor or circuit is configured to further function as determination unit configured to determine whether or not an operation to return the aperture from the second aperture opening state to the first aperture opening state is to be performed.

13. The image capturing apparatus according to claim 12, wherein the determination unit does not determine that an operation to return the aperture from the second aperture opening state to the first aperture opening state is to be performed, until a defocus amount detected by the focus detection unit becomes less than a fifth predetermined value, in the second aperture opening state.

14. The image capturing apparatus according to claim 1, wherein the at least one processor or circuit is configured to further function as a determination unit configured to determine, if reliability of the focus detection is less than a first predetermined value, whether or not search driving of the focus lens is to be performed.

15. The image capturing apparatus according to claim 1, wherein the image sensor includes a plurality of photoelectric conversion portions in one pixel.

16. The image capturing apparatus according to claim 1, wherein the image sensor includes a pixel dedicated to focus detection, a portion of a photoelectric conversion portion of the pixel being shielded.

17. The image capturing apparatus according to claim 1, wherein the first aperture opening state is a full-open aperture.

18. A method of controlling an image capturing apparatus, comprising:
detecting a focus state of an imaging optical system;
determining reliability of the focus detection; and
controlling an opening of an aperture of the imaging optical system,
wherein in the controlling,
if reliability of the focus detection performed in a state in which the opening of the aperture is controlled to a first aperture opening state is less than a threshold value, in the determining reliability,
the aperture is changed to a second aperture opening state in which the opening of the aperture is reduced relative to the first aperture opening state, and
wherein, in the controlling, the aperture is not changed to the second aperture opening state if a predetermined condition is satisfied.

19. A non-transitory computer-readable storage medium storing a program for executing steps of a method of controlling an image capturing apparatus, the method comprising:
detecting a focus state of an imaging optical system;
determining reliability of the focus detection; and
controlling an opening of an aperture of the imaging optical system, wherein in the controlling, if reliability of the focus detection performed in a state in which the opening of the aperture is controlled to a first aperture opening state is less than a threshold value, in the determining reliability, the aperture is changed to a second aperture opening state in which the opening of the aperture is reduced relative to the first aperture opening state, and wherein, in the controlling, the aperture is not changed to the second aperture opening state if a predetermined condition is satisfied.

* * * * *